US012710490B2

(12) United States Patent
Mehendale et al.

(10) Patent No.: US 12,710,490 B2
(45) Date of Patent: Aug. 18, 2026

(54) SYSTEM AND METHOD FOR PERFORMING CHARACTERIZATION OF A SAMPLE

(71) Applicant: Onto Innovation Inc., Wilmington, MA (US)

(72) Inventors: Manjusha Mehendale, Morristown, NJ (US); George Andrew Antonelli, Flanders, NJ (US); Robin A. Mair, West Chicago, IL (US); Priya Mukundhan, Lake Hopatcong, NJ (US)

(73) Assignee: Onto Innovation Inc., Wilmington, MA (US)

( * ) Notice: Subject to any disclaimer, the term of this patent is extended or adjusted under 35 U.S.C. 154(b) by 108 days.

(21) Appl. No.: 18/851,328

(22) PCT Filed: Mar. 31, 2022

(86) PCT No.: PCT/US2022/022936
§ 371 (c)(1),
(2) Date: Sep. 26, 2024

(87) PCT Pub. No.: WO2023/191800
PCT Pub. Date: Oct. 5, 2023

(65) Prior Publication Data
US 2025/0189605 A1 Jun. 12, 2025

(51) Int. Cl.
*G01R 33/12* (2006.01)
*G01R 1/07* (2006.01)
*G01R 31/308* (2006.01)

(52) U.S. Cl.
CPC ............ *G01R 33/12* (2013.01); *G01R 1/071* (2013.01); *G01R 31/308* (2013.01)

(58) Field of Classification Search
CPC ....... G01R 33/12; G01R 1/071; G01R 31/308
See application file for complete search history.

(56) References Cited

U.S. PATENT DOCUMENTS 9,348,000 B1 * 5/2016 Pressesky .......... G01R 33/0325
2009/0212769 A1 8/2009 Stoica et al.
(Continued)

FOREIGN PATENT DOCUMENTS

CN 20389415 U 3/2014
CN 106556809 A 4/2017
(Continued)

OTHER PUBLICATIONS

International Preliminary Report on Patentability dated Oct. 10, 2024, in PCT/US2022/022936, filed Mar. 31, 2022.
International Search Report and Written Opinion dated Dec. 26, 2022, for PCT Application No. PCT/US022/022936, Filed Mar. 31, 2022.
(Continued)

*Primary Examiner* — Paresh Patel
(74) *Attorney, Agent, or Firm* — Paradice & Li LLP

(57) ABSTRACT

An optical metrology device includes a selectable pump arm that is used to produce a transient response in the target sample and a probe arm and may be configured to perform static Magneto-Optic Kerr Effect (MOKE) measurements or ellipsometry measurements when the pump arm is not selected, and time resolved (TR) MOKE measurements or ellipsometry measurements when the pump arm is selected. The optical metrology device may be further configured to perform opto-acoustic measurements when the pump arm is selected. A pulse shaper in the pump arm may be used to modify the pulse duration, phase, or both, of the incident pump beam to enable measurement of the dependence of the magnetic dynamics on the pump pulse characteristics. The optical metrology device may be configured to operate at a single selectable wavelength or multiple wavelengths in a continuous or discontinuous spectrum.

27 Claims, 12 Drawing Sheets

(56) References Cited

U.S. PATENT DOCUMENTS

| | | | | |
|---|---|---|---|---|
| 2013/0093419 | A1* | 4/2013 | An | G01N 21/63 324/244.1 |
| 2020/0126873 | A1* | 4/2020 | Noh | H10P 72/78 |
| 2021/0118753 | A1 | 4/2021 | Noh | |

FOREIGN PATENT DOCUMENTS

| | | | |
|---|---|---|---|
| CN | 114428059 | A | 5/2022 |
| JP | 2010223822 | A | 10/2010 |
| JP | 2011175093 | A | 9/2011 |
| JP | 2012007962 | A | 1/2012 |
| JP | 2014215214 | A | 11/2014 |
| JP | 4008730 | B2 | 11/2017 |
| WO | 2019178262 | A1 | 9/2019 |
| WO | 2020221836 | A1 | 11/2020 |

OTHER PUBLICATIONS

A.V. Khvalkovskiy et al., "Basic principles of the STT-MRAM cell operation in memory arrays," Journal of Physics D: Applied Physics, vol. 46, No. 7, 10.1088/0022-3727/46/7/074001, 35 pages.

Cahill et al, "Time-resolved magneto-optical Kerr effect for studies of phonon thermal transport," https://users.mrl.illinois.edu/cahill/mrs_nov15.pdf, 21 pages.

Oakberg, "Magneto-Optic Kerr Effect," Hinds Instruments, https://www.hindsinstruments.com/wp-content/uploads/Magneto-Optic-Kerr-Effect-Application-Note.pdf.

Atkinson, "Magnetism in a New Light," PEM, Hinds Instruments, Inc., Fall 2001, https://www.hindsinstruments.com/wp-content/uploads/pem-10-MOKE-1.pdf.

Bivas Rana, "Quasistatic and ultrafast magnetization dynamics in magnetic nanostructures", Ph. D thesis (University of Calcutta, 2013); Chapter 4; 262 pages.

* cited by examiner

400
Light Source
402
HWP1
P1
403
Beam Exp
404
406
M1
408
410
Probe
Pump
M2
M3
M4
M5
420
422
Pulse Shaper
424
EOM
426
P2
Motorized HWP2
Motorized HWP3
430
432
M9
M10
M11
M12
WL
AOF
433
434
436
M13
M6
438
M7
EOM
439
M8
M14
L1
L2
L3
Sample
412
414
416
428
Vision System
429
M16
M15
440
442
443
444
446
448
LIA
450
452
454
456
457
458
459

SYSTEM AND METHOD FOR PERFORMING CHARACTERIZATION OF A SAMPLE

CROSS REFERENCE TO RELATED APPLICATIONS

This application is a National Stage Entry filed under 35 U.S.C. 371 of PCT/US2022/022936, filed on Mar. 31, 2022, and entitled "SYSTEM AND METHOD FOR PERFORMING CHARACTERIZATION OF A SAMPLE," which is assigned to the assignee hereof and is incorporated herein by reference in its entirety.

FIELD OF THE DISCLOSURE

Embodiments of the subject matter described herein are related generally to non-destructive measurement of a sample, and more particularly to characterization of a sample using optical metrology.

BACKGROUND

Semiconductor and other similar industries often use optical metrology equipment to provide non-contact evaluation of substrates during processing. With optical metrology, a sample under test is illuminated with light, e.g., at a single wavelength or multiple wavelengths. After interacting with the sample, the resulting light is detected and analyzed to determine a desired characteristic of the sample.

There are many different techniques for measuring characteristics of samples such as, for example, semiconductors. One such technique relies on Magneto-Optic Kerr Effect (MOKE), in which the polarization change of polarized incident light due to the magnetic field from a sample is measured from the reflected light. The change in polarization due to MOKE, for example, may be useful for monitoring the electric and magnetic properties of samples. Another technique is ellipsometry, in which the polarization change of polarized incident light due to sample materials and geometries is measured from the reflected light. The change in polarization is then related to characteristics of the sample. Another technique is opto-acoustic metrology, in which an acoustic wave generated with a pump beam reflects a portion of a probe beam that interferes with another portion of the probe beam reflected from a surface interface. The interference measurements produced using opto-acoustic metrology may provide information about characteristics of the sample.

While optical metrology techniques, such as MOKE, ellipsometry, and opto-acoustic metrology are useful for analysis of samples, optical metrology devices using such techniques may be improved.

SUMMARY

An optical metrology device includes a selectable pump arm that is used to produce a transient response in the target sample and a probe arm and may be configured to perform static Magneto-Optic Kerr Effect (MOKE) measurements when the pump arm is not selected, and time resolved (TR) MOKE measurements when the pump arm is selected. The optical metrology device may similarly perform ellipsometry measurements when the pump arm is not selected, and time resolved (TR) ellipsometry measurements when the pump arm is selected. The optical metrology device may be further configured to perform opto-acoustic measurements when the pump arm is selected. A pulse shaper in the pump arm may be used to pulse duration, phase, or both, of the incident pump beam to enable measurement of the dependence of the magnetic dynamics on the pump pulse characteristics. The optical metrology device may be configured to operate at a single selectable wavelength or multiple wavelengths in a continuous or discontinuous spectrum.

In one implementation, an apparatus for measuring at least one property including a magnetic property of a target sample using at least one of static magneto-optical Kerr effect (MOKE), time-resolved MOKE (TR MOKE), or a combination thereof, may include a pulsed light source for generating a pulsed light beam. A selectable pump arm may be configured to receive at least a portion of the pulsed light beam and irradiate the target sample with one or more pump pulses to cause transient perturbation in the target material if the pump arm is selected and to not irradiate the target sample if the pump arm is not selected. A probe arm may be configured to receive at least a portion of the pulsed light beam, and irradiate the target sample with one or more polarized probe pulses to produce reflected probe pulses with polarization states affected by the magnetic property of the target sample, and are modulated based on the transient perturbation in the target material if the pump arm is selected. One or more detectors may be configured for receiving reflected probe pulses from the target sample. At least one processor coupled to the one or more detectors may be configured to measure the at least one property including the magnetic property of the target sample based on static MOKE if the pump arm is not selected and based on TR MOKE if the pump arm is selected.

In one implementation, a method for measuring at least one property including a magnetic property of a target sample using at least one of static magneto-optical Kerr effect (MOKE), time-resolved MOKE (TR MOKE), or a combination thereof, includes generating a pulsed light beam with a pulsed light source. The method may further include selecting a pump arm to receive at least a portion of the pulsed light beam and irradiate the target sample with one or more pump pulses to cause transient perturbation in the target material or not selecting the pump arm so that the target sample is not irradiated with the one or more pump pulses. The method may further include receiving at least a portion of the pulsed light beam in a probe arm and irradiating the target sample with one or more polarized probe pulses to produce reflected probe pulses with polarization states affected by the magnetic property of the target sample, and are modulated based on the transient perturbation in the target material if pump arm is selected. The method may further include detecting reflected probe pulses from the target sample with one or more detectors. The method may further include determining the at least one property including the magnetic property of the target sample based on the reflected probe pulses and static MOKE measurements if the pump arm is not selected and based on the reflected probe pulses and TR MOKE if the pump arm is selected.

In one implementation, an apparatus for measuring at least one property including a magnetic property of a target sample using at least one of static magneto-optical Kerr effect (MOKE), time-resolved MOKE (TR MOKE), or a combination thereof includes means for generating a pulsed light beam. The apparatus further includes means for selecting a pump arm to receive at least a portion of the pulsed light beam and irradiate the target sample with one or more pump pulses to cause transient perturbation in the target material or not selecting the pump arm so that the target sample is not irradiated with the one or more pump pulses.

The apparatus further includes means for receiving at least a portion of the pulsed light beam in a probe arm and irradiating the target sample with one or more polarized probe pulses to produce reflected probe pulses with polarization states affected by the magnetic property of the target sample, and are modulated based on the transient perturbation in the target material if pump arm is selected and a means for detecting reflected probe pulses from the target sample. The apparatus includes a means for determining the at least one property including the magnetic property of the target sample based on the reflected probe pulses and static MOKE measurements if the pump arm is not selected and based on the reflected probe pulses and TR MOKE if the pump arm is selected.

In one implementation, an apparatus for measuring at least one property including a magnetic property of a target sample using at least one of time-resolved magneto-optical Kerr effect (MOKE) measurements, opto-acoustic measurements, or a combination thereof, includes a pulsed light source for generating a pulsed light beam. A pump arm may be configured to receive at least a portion of the pulsed light beam and irradiate the target sample with one or more pump pulses to cause transient perturbation in the target material. A probe arm may be configured to receive at least a portion of the pulsed light beam, and irradiate the target sample with one or more polarized probe pulses to produce reflected probe pulses, the probe arm comprising a phase modulator configured to periodically phase modulate the one or more polarized probe pulses for the time-resolved MOKE measurements, and configured to not phase modulate the one or more pulses for the opto-acoustic measurements. One or more detectors may be configured for receiving a reflected probe pulses from the target sample. At least one processor coupled to the one or more detectors may be configured to measure an effect on polarization states of the probe pulses due to magnetic property of the target sample for the time-resolved MOKE measurements if the phase modulator periodically phase modulates the one or more probe pulses and to measure a change in reflectivity of the probe beam as a function of time delay between each pump pulse and probe pulse for the opto-acoustic measurements if the phase modulator does not phase modulate the one or more pulses.

In one implementation, a method for measuring at least one property including a magnetic property of a target sample using at least one of time-resolved magneto-optical Kerr effect (MOKE) measurements, opto-acoustic measurements, or a combination thereof, may include generating a pulsed light beam with a pulsed light source. The method may include receiving at least a portion of the pulsed light beam in a pump arm and irradiating the target sample with one or more pump pulses to cause transient perturbation in the target material. The method may include receiving at least a portion of the pulsed light beam in a probe arm and irradiating the target sample with one or more polarized probe pulses to produce reflected probe pulses, the probe arm comprising a phase modulator configured to periodically phase modulate the one or more polarized probe pulses for the time-resolved MOKE measurements, and configured to not phase modulate the one or more pulses for the opto-acoustic measurements. The method may include detecting reflected probe pulses from the target sample with one or more detectors. The method may include determining an effect on polarization states of the probe pulses based on the reflected probe pulses due to magnetic property of the target sample for the time-resolved MOKE measurements if the phase modulator periodically phase modulates the one or more probe pulses and determining a change in reflectivity of the probe beam as a function of time delay between each pump pulse and probe pulse based on the reflected probe pulses for the opto-acoustic measurements if the phase modulator does not phase modulate the one or more pulses.

In one implementation, an apparatus for measuring at least one property including a magnetic property of a target sample using at least one of time-resolved magneto-optical Kerr effect (MOKE) measurements, opto-acoustic measurements, or a combination thereof, the apparatus includes a means for generating a pulsed light beam. The apparatus may include a means for receiving at least a portion of the pulsed light beam in a pump arm and irradiating the target sample with one or more pump pulses to cause transient perturbation in the target material and a means for receiving at least a portion of the pulsed light beam in a probe arm and irradiating the target sample with one or more polarized probe pulses to produce reflected probe pulses, the probe arm comprising a phase modulator configured to periodically phase modulate the one or more polarized probe pulses for the time-resolved MOKE measurements, and configured to not phase modulate the one or more pulses for the opto-acoustic measurements. The apparatus may further include a means for detecting reflected probe pulses from the target sample; and means for determining an effect on polarization states of the probe pulses based on the reflected probe pulses due to magnetic property of the target sample for the time-resolved MOKE measurements if the phase modulator periodically phase modulates the one or more probe pulses and determining a change in reflectivity of the probe beam as a function of time delay between each pump pulse and probe pulse based on the reflected probe pulses for the opto-acoustic measurements if the phase modulator does not phase modulate the one or more pulses.

In one implementation, an apparatus for measuring at least one property including a magnetic property of a target sample using at least one of time-resolved magneto-optical Kerr effect (MOKE) measurements, ellipsometry measurements, or a combination thereof, includes a pulsed light source for generating a pulsed light beam. A selectable pump arm may be configured to receive at least a portion of the pulsed light beam and irradiate the target sample with one or more pump pulses to cause transient perturbation in the target material if the pump arm is selected and to not irradiate the target sample if the pump arm is not selected. A probe arm may be configured to receive at least a portion of the pulsed light beam, and irradiate the target sample with one or more polarized probe pulses to produce reflected probe pulses, the probe arm comprising a phase modulator configured to periodically phase modulate the one or more polarized probe pulses. One or more detectors may be for receiving a reflected probe pulses from the target sample. At least one processor coupled to the one or more detectors may be configured to measure an effect on polarization states of the probe pulses due to magnetic property of the target sample for the time-resolved MOKE measurements if the pump arm is selected and to measure effect on polarization states of the probe pulses due to non-magnetic properties of the target sample for the ellipsometry measurements if the pump arm is not selected.

In one implementation, a method for measuring at least one property including a magnetic property of a target sample using at least one of time-resolved magneto-optical Kerr effect (MOKE) measurements, ellipsometry measurements, or a combination thereof, may include generating a pulsed light beam with a pulsed light source. The method may include selecting a pump arm to receive at least a portion of the pulsed light beam and irradiate the target sample with one or more pump pulses to cause transient perturbation in the target material and not selecting the pump arm so that the target sample is not irradiated with the one or more pump pulses. The method may include receiving at least a portion of the pulsed light beam in a probe arm and irradiating the target sample with one or more polarized probe pulses to produce reflected probe pulses, the probe arm comprising a phase modulator configured to periodically phase modulate the one or more polarized probe pulses. The method may include detecting reflected probe pulses from the target sample with one or more detectors. The method may include determining an effect on polarization states of the probe pulses based on the reflected probe pulses due to magnetic property of the target sample for the time-resolved MOKE measurements if the pump arm is selected and determining an effect on polarization states of the probe pulses based on the reflected probe pulses due to non-magnetic properties of the target sample for the ellipsometry measurements if the pump arm is not selected.

In one implementation, an apparatus for measuring at least one property including a magnetic property of a target sample using at least one of time-resolved magneto-optical Kerr effect (MOKE) measurements, ellipsometry measurements, or a combination thereof, includes a means for generating a pulsed light beam. The apparatus includes a means for selecting a pump arm to receive at least a portion of the pulsed light beam and irradiate the target sample with one or more pump pulses to cause transient perturbation in the target material and or not selecting the pump arm so that the target sample is not irradiated with the one or more pump pulses. The apparatus includes a means for receiving at least a portion of the pulsed light beam in a probe arm and irradiating the target sample with one or more polarized probe pulses to produce reflected probe pulses, the probe arm comprising a phase modulator configured to periodically phase modulate the one or more polarized probe pulses. The apparatus may further include a means for detecting reflected probe pulses from the target sample and a means for determining an effect on polarization states of the probe pulses based on the reflected probe pulses due to magnetic property of the target sample for the time-resolved MOKE measurements if the pump arm is selected and determining an effect on polarization states of the probe pulses based on the reflected probe pulses due to non-magnetic properties of the target sample for the ellipsometry measurements if the pump arm is not selected.

DETAILED DESCRIPTION

Figure 1A:
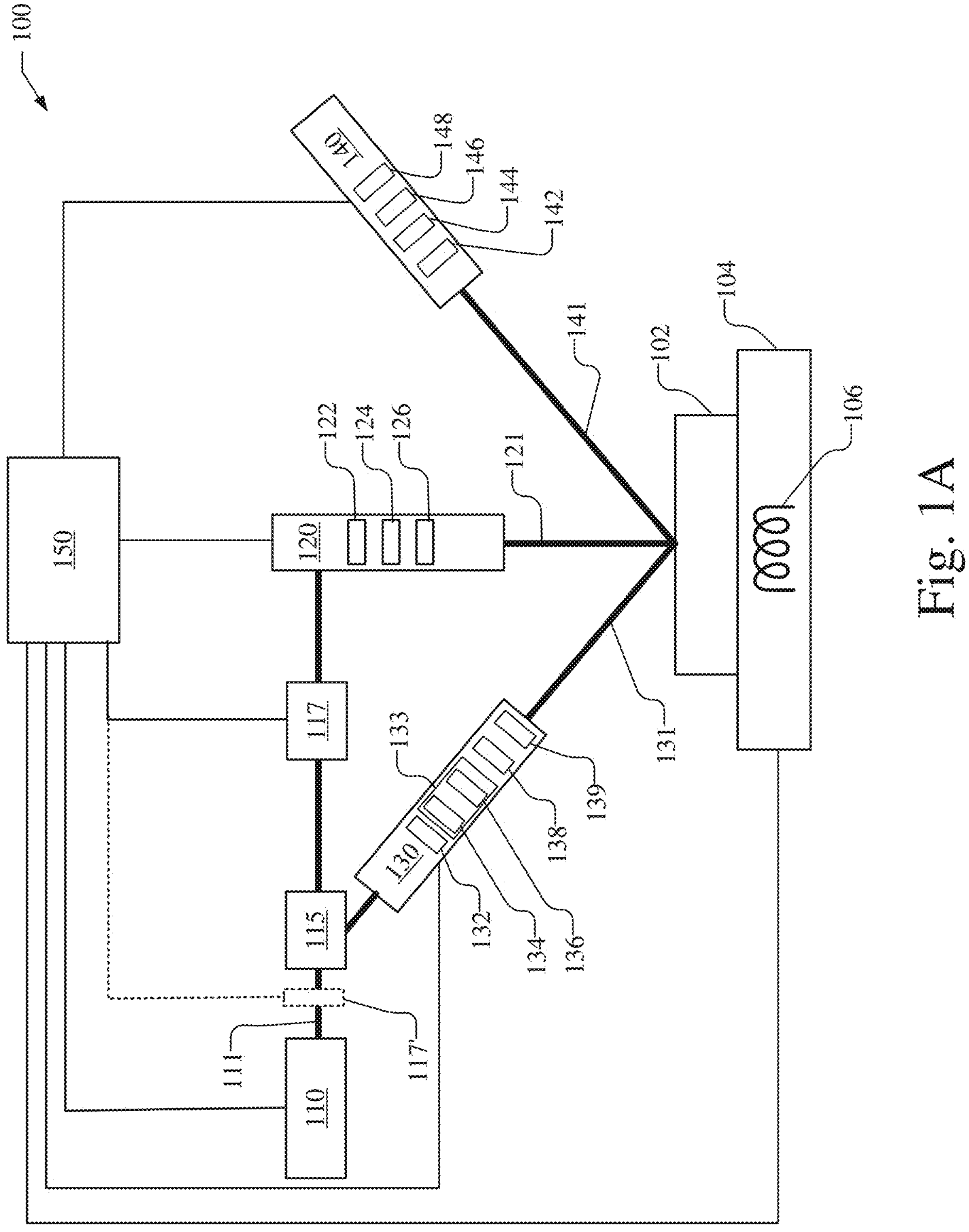
FIG. 1A illustrates a schematic representation of an optical metrology device that may employ various metrology techniques, including one or more of static MOKE measurements, time resolved MOKE measurements, opto-acoustic measurements, static ellipsometry measurements, dynamic time resolved ellipsometry measurements, or any combination thereof.

During fabrication of semiconductor and similar devices it is sometimes necessary to monitor the fabrication process by non-destructively measuring the devices. Optical metrology is sometimes employed for non-contact evaluation of samples during processing. By way of example, the recent rise of the magnetic random access memory (MRAM) technology has prompted the need for efficient metrology techniques for characterization of magnetic tunnel junctions (MTJ). Monitoring of the electric and magnetic properties of magnetic tunnel junctions (MTJ) is important for process control. One techniques that may be employed for such a purpose is Magneto-Optic Kerr Effect (MOKE). When a polarized light is reflected by a sample subjected to a magnetic field the reflected light suffers the rotation of the direction of polarization or addition of the ellipticity. The behavior of an incident laser beam reflected from an MRAM stack changes as the applied magnetic field varies. MOKE testing may determine the orientation, coercive field, and thermal stability of the individual layers or the combined stack. Moreover, if the magnetic layers fail to realign themselves in response to a magnetic field, the magnetic layer will also fail to switch electronically. Accordingly, MOKE may be used to test the switching ability of the sample.

As described herein, an optical metrology device may use MOKE for testing samples using a linearly polarized light that is periodically (with frequency f) phase modulated. The reflected light intensity at the detector has contributions from components at dc ($I_{dc}$), fundamental (f) and second harmonic (2f) of the modulation frequency. The reflected signal may be demodulated using lock-in detection technique to calculate the polarization rotation and ellipticity from dc, f and 2f components.

It is sometimes desirable to obtain multiple types of information from a sample during measurement. Accordingly, as described herein, an optical metrology device may be configured to obtain multiple types of optical metrology measurements, including static MOKE measurements, time resolved MOKE measurements, opto-acoustic measurements, static ellipsometry measurements, dynamic time resolved ellipsometry measurements, or any combination thereof.

For example, the optical metrology device may be configured for multiple types of MOKE measurements, including static MOKE measurements, as well as transient (e.g., sometimes referred to as "time-resolved (TR)") MOKE measurements. In some implementations, the optical metrology device may be configured for TR MOKE measurements with a resolution of, e.g., approximately 20 fs, thereby allowing the study of spin dynamics in magnetic media samples. For example, the optical metrology device may include a magnetic field generator at or near the sample, e.g., in the chuck holding the sample, to generate a magnetic field while the sample, e.g., a MRAM wafer, is loaded and undergoing testing.

The optical metrology device may perform TR MOKE measurements to study the interaction of ultrafast lasers with ferromagnetic metals. For example, the optical metrology device may induce magnetization dynamics using, e.g., femtosecond pump laser pulses. The optical metrology device may optionally include a pulse shaper to vary the pulse duration, phase, or both, of the incident pump beam. The pulse shaper, which may be a spatial light modulator (SLM) or an acousto-optic modulator (AOM), may vary the shape of the pump pulse, thereby enabling study of the dependence of the magnetic dynamics on the pump pulse characteristics. Furthermore, the optimum pulse shape that yields a desirable control over the magnetic dynamics in the sample under consideration may be adaptively determined using the pulse shaper.

In some implementations, the optical metrology device may be configured for one or more types of MOKE measurements, along with one or more other types of measurements. For example, the optical metrology device may be configured for opto-acoustic measurements, such as time resolved picosecond acoustic measurements. For example, the optical metrology device may employ one or more electro-optic modulators (EOMs) to modulate the amplitude (i.e., intensity) of the pump and probe beams for opto-acoustic measurements, as well as one or more types of MOKE measurements. In some implementations, other types of modulators may be used, such as an acousto-optic modulator (AOM), photoelastic modulators (PEM), or a rotating compensators.

In another example, the optical metrology device may be configured for ellipsometry measurement along with one or more types of MOKE measurements and/or the opto-acoustic measurements. For example, an EOM (or other types of modulators, such as an AOM, PEM or rotating compensator) may be configured to operate as a phase modulator for ellipsometry measurements. The optical metrology device, for example, may be configured to perform static ellipsometry measurements and/or time resolved ellipsometry measurements.

The use of EOMs, AOMs, or PEMs for amplitude or phase modulation in the optical metrology device may be advantageous as it provides the ability to carry out measurements at high sensitivity, low noise and at a fast speed. Moreover, the EOM or AOM, PEM may be easily configured to run measurements including one or more of the opto-acoustic measurements, static ellipsometry measurements, dynamic time resolved ellipsometry measurements, static MOKE measurements, and time resolved MOKE measurements, or any combination thereof.

In some implementations, the optical metrology device may employ an optical geometry that modulates both the pump beam and probe beam individually and may physically separate the beam path for the pump beam and the probe beam, e.g., with the pump beam normally incident on the sample and the probe beam obliquely incident on the sample. The separation of the beam paths and individual modulation of the pump beam and probe beam may benefit signal to noise enhancement, as well as enable the ability to easily switch between different types of measurements.

In some implementations, the optical metrology device may be configured to operate in a single (narrowband) wavelength, or to operate in multiple (broadband) wavelengths. For example, the optical metrology device may include a super continuum generator in the probe beam, to enable multi wavelength measurements, including MOKE measurements, opto-acoustic measurements, and ellipsometry measurements. By enabling the ability to vary the probe wavelength, e.g., from the visible to near infrared spectral range, a wide range of materials may be measured. In some implementations, an acousto-optic filter may be used to select particular wavelengths for studying different types of materials.

FIG. 1A illustrates a schematic representation of an optical metrology device 100 that may employ various metrology techniques, including one or more of static MOKE measurements, time resolved MOKE measurements, opto-acoustic measurements, static ellipsometry measurements, dynamic time resolved ellipsometry measurements, or any combination thereof. The optical metrology device 100 may be further configured to employ a pulse shaper for pulses in the pump beam and a super continuum generator for expanding or selecting wavelengths for one or more types of metrology techniques. It should be understood that FIG. 1A illustrates a simplified view of the optical metrology device 100 and that additional optical components, e.g., lenses, polarizers, waveplates, etc. may be included.

The optical metrology device 100 includes a pulsed light source 110 that produces a pulsed light beam 111. The pulsed light source 110, for example, may be a single wavelength, or narrowband laser. In some implementations, the pulsed light source 110 may be a pulsed laser that produces the pulsed light beam 111. In some configurations the pulsed light source 110 may produce a pulse width in the range of several hundred femtoseconds to several hundred picoseconds.

A beam splitter 115 receives the pulsed light beam 111 and directs a first portion towards a probe arm 130 and directs a second portion towards a selectable pump arm 120. A beam selecting element 117 may be disposed between the beam splitter 115 and target sample 102 (e.g., before or in the pump arm 120) and is used to select the pump arm 120 or to not select, i.e., exclude, the pump arm 120 during measurements of the target sample 102. The beam selecting element 117 may be a movable element, such as a shutter or flip mirror, or may be stationary and electrically controlled, such as an electrochromic optical switch. In another implementation, as illustrated with dotted lines, the beam selecting element 117 may be before the beam splitter 115. For example, the beam selecting element 117 may be a polarizer 117' and the beam splitter 115 may be a polarized beam splitter, which splits and directs light based on polarization state. The beam selecting element 117 may be configured (e.g., the polarizer rotated) to produce a polarization state in the pulsed light beam 111 that causes the polarized beam splitter 115 to direct a portion of the pulsed light beam 111 to the probe arm 130 and another portion to the pump arm 120 (e.g., 50% to the probe arm 130 and 50% to the pump arm 120), and may be configured (e.g., the polarizer rotated) to produce a polarization state in the pulsed light beam 111 that causes the polarized beam splitter 115 to direct all of the pulsed light beam 111 to the probe arm 130 (e.g., 100% to the probe arm 130 and 0% to the pump arm 120). Other arrangements and types of beam selecting element 117 may be used if desired.

The pump arm 120 may be selectable, e.g., using selecting element 117, for use during measurement of the target sample 102. When selected, the pump arm 120 receives at least a portion of the pulsed light beam 111 and directs a pump beam 121, which is pulsed, to the target sample 102. As illustrated in FIG. 1A, the pump beam 121 may be directed (e.g., focused) by one or more lenses (not shown) to be normally incident on the target sample 102, but non-normal angles of incidence may be used if desired, e.g., including but not limited to between normal and 70° incidence angle. The pump beam 121 produced by the pump arm 120 when the pump arm 120 is selected irradiates the target sample 102 and causes a transient perturbation in the material of the target sample 102, and if the pump arm 120 is not selected, the pump beam 121 does not irradiate the target sample 102.

In some implementations the pump arm 120 may include a delay stage 122 for increasing or decreasing the length of the optical path between the pulsed light source 110 and the target sample 102 to control the delay of the pulses in the pump beam 121. The delay stage 122, for example, may vary the optical path length to control a time delay between irradiating the target sample 102 with each pulse in the pump beam 121 and irradiating the target sample 102 with a corresponding pulse in a probe beam 131.

The pump arm 120 may further include a pulse shaper 124 that receives the portion of the pulsed light beam 111 and varies at least one of a duration, phase, or both of the pulses in the pulsed light beam to produce the pump beam 121. The pulse shaper 124, for example, may be a spatial light modulator or an acousto-optic modulator. By way of example, all optical switching (AOS) of magnetic materials is a field of interest due to the demand to control magnetization in devices in a faster and more efficient manner. The study of the interaction of ultrafast lasers with ferromagnetic metals may lead to greater advances in future magnetic data storage devices. The pump beam 121 may be configured to induce magnetization dynamics, e.g., using femtosecond pump laser pulses. Optical metrology device 100 may be used to study the optically induced magneto dynamics. Controlling the shape of the pulses of the pump beam 121 by varying the pulse duration and/or phase of the incident pump beam 121 using pulse shaper 124 may be used advantageously to determine the dependence of the magnetic dynamics in the target sample 102 on the pump pulse characteristics. Moreover, an adaptive algorithm may be used to define and use the optimum pulse shape of the pump beam 121 to yield desirable control over the magnetic dynamics in the target sample 102 under consideration.

The pump arm 120 may further include a modulator 126 to modulate the amplitude (intensity) of the pump beam 121. For example, the modulator 126 may modulate the amplitude (intensity) of the polarized probe pulses in the pump beam 121. The modulator 126 may be an electro-optic modulator (EOM), acousto-optic modulator (AOM), photoelastic modulator (PEM), or a rotating compensator, which may modulate amplitude (intensity) of the pump beam 121, which is advantageous as it enables measurements at high sensitivity, low noise and at a fast speed.

Many other alternative configurations of the pump arm 120 are also possible. For example, the pump arm 120 may include only the delay stage 122, the modulator 126, or the pulse shaper 124, or may include any combination thereof. Further additional optical elements may be present in the pump arm 120. It should be appreciated that the illustration of pump arm 120 in FIG. 1A is not intended to be limiting, but rather depict one of a number of example configurations.

The probe arm 130 receives at least a portion of the pulsed light beam 111 and directs a probe beam 131, e.g., which may include one or more polarized pulses, to irradiate the target sample 102. The probe beam 131 may be directed (e.g., focused) by lenses (not shown) to be obliquely incident on the target sample 102, e.g., at any angle between 5 and 85 degrees from normal.

The probe arm 130, for example, may include one or more polarization elements 138 (e.g., polarizer(s) and/or waveplate(s)) that produce one or more polarization states and optional phase shifts, which may be configurable, e.g., rotatable, to produce a desired polarization state in the probe beam 131. In some implementations, the probe arm 130 may include a delay stage 132 for increasing or decreasing the length of the optical path between the pulsed light source 110 and the target sample 102 to control the delay of the pulses in the probe beam 131.

The probe arm 130 may further include a wavelength selector 133 that may be used to receive that receives the at least a portion of the pulsed light beam 111 and select one or more wavelengths to be used in the probe beam 131. The wavelength selector, for example, may include a multi-wavelength generator 134, which may receive a single wavelength or narrowband, e.g., produced by a laser, in the pulsed light beam 111 and spectrally broadens the at least a portion of the pulsed light beam 111. The multi-wavelength generator 134, for example, may be a supercontinuum generator that spectrally broadens light. In some implementations, the multi-wavelength generator 134, for example, may be a multiple harmonic generator, such as a frequency doubling crystal (DBO), that receives a narrow band of wavelengths and produces a wider band of wavelengths. In some implementations, the multi-wavelength generator 134 may be photonic crystal fibers that receive a narrow band of wavelengths and produce a produces wider band of wavelengths. In some implementations, the multi-wavelength generator 134 spectrally broadens the pulsed light beam 111 to produce a continuous optical spectrum. In some implementations, the multi-wavelength generator 134 spectrally broadens the pulsed light beam 111 to produce multiple discontinuous optical spectral bands. The multi-wavelength generator 134 enables an ability to increase the wavelengths of the probe beam 131, e.g., from visible to near infrared spectral range, which may be continuous or discontinuous wavelengths, and which may be used for spectroscopic measurement of the target sample 102 or may be filtered to select a particular wavelength or narrowband of wavelengths for measurement of the target sample 102. For example, in some implementations, the wavelength selector 133 may further include a filter 136, such as an acousto-optic filter, that when used with the multi-wavelength generator 134 enables an ability to select one or more specific wavelengths to be included in the probe beam 131, e.g., from visible to near infrared spectral range to be used for measuring a target sample 102. For example, some sample materials are opaque to certain wavelengths and transparent at other wavelengths. With the use of the multi-wavelength generator 134 and filter 136 in the wavelength selector 133, the wavelength(s) included in the probe beam 131 may be specifically selected by the optical metrology device 100 based on the type of material of the target sample 102, which enables measurement of a wide range of different materials.

The probe arm 130, for example, may include one or more polarization elements 138 (e.g., polarizer(s) and/or waveplate(s)) that produce one or more polarization states and optional phase shifts, which may be configurable, e.g., rotatable, to produce a desired polarization state in the probe beam 131.

The probe arm 130 may further include a modulator 139 to modulate the amplitude and/or the phase of the probe beam 131. For example, the modulator 139 may modulate the amplitude (intensity) of the polarized probe pulses in the probe beam 131. The modulator 139 may periodically phase modulate polarized probe pulses in the probe beam 131. The modulator 139 may be an EOM, an AOM, PEM, or a rotating compensator, which may modulate amplitude and/or phase of the probe beam 131. The use of an EOM, for example, may be advantageous as it enables measurements at high sensitivity, low noise and at a fast speed.

Many other alternative configurations of the probe arm 130 are also possible. For example, the probe arm 130 may include only the polarization elements 138, the delay stage 132, the wavelength selector 133 (including one or more of the multi-wavelength generator 134 and filter 136), the modulator 139, or may include any combination thereof. Further additional optical elements may be present in the probe arm 130. It should be appreciated that the illustration of probe arm 130 in FIG. 1A is not intended to be limiting, but rather depict one of a number of example configurations.

The pump beam 121 (if used) and the probe beam 131 interact with target sample 102 and the probe beam 131 is reflected from the target sample 102 to a detector arm 140 as a reflected beam 141. The detector arm 140 includes one or more polarizing elements 142, which may be used to analyze the polarization state of the reflected beam 141. The one or more polarizing elements 142, for example, may be a polarizing beam splitter, polarizers, etc., that may be used to determine the polarization state of the reflected beam 141. The detector arm 140 further includes one or more detectors, e.g., detectors 144 and/or 146, that receive the reflected probe pulses in the reflected beam 141 from the target sample 102. If two detectors 144 and 146 are used in the detector arm 140, they may detect different polarization states, e.g., orthogonal polarization states. For example, detector 144 may detect P state polarization of the reflected probe pulses in the reflected beam 141 and the detector 146 may detect S state polarization of the reflected probe pulses. The one or more detectors 144 and/or 146 may be connected to a lock-in amplifier 148 that demodulate signals from the detectors 144 and/or 146 that are generated based on the received reflected probe pulses in the reflected beam 141 from the target sample 102.

Many other alternative configurations of the detector arm 140 are also possible. For example, the detector arm 140 may include detector 144, detector 146, lock-in amplifier 148 or any combination thereof. Further additional optical elements may be present in the detector arm 140. It should be appreciated that the illustration of detector arm 140 in FIG. 1A is not intended to be limiting, but rather depict one of a number of example configurations.

The pulsed light source 110, pump arm 120, probe arm 130, and detector arm 140 are connected to and controlled by a controller 150. Additionally, the controller 150 may be connected to and control a stage 104 that holds the target sample 102 and includes actuators to move the target sample 102 based on controls signals from the controller 150 to position the target sample 102 at desired measurement positions. The stage 104, for example, may be capable of horizontal motion in either Cartesian (i.e., X and Y) coordinates, or Polar (i.e., R and θ) coordinates or some combination of the two. The stage 104 may also be capable of vertical motion along the Z coordinate.

The optical metrology device 100 may further include a magnetic element 106, e.g., electromagnet, which may be in the stage 104 or external to the stage 104, to apply a magnetic field to the target sample 102 during measurements. Application of the magnetic field may be controlled by the controller 150.

The controller 150 may further control the operation of a chuck on the stage 104 used to hold or release the target sample 102. It should be appreciated that the controller 150 may be a self-contained or distributed computing device capable of performing necessary computations, receiving, and sending instructions or commands and of receiving, storing, and sending information related to the metrology functions of the system.

The controller 150 includes one or more processors and may be a workstation, a personal computer, central processing unit or other adequate computer system, or multiple systems. It should be understood that controller 150 includes one processor, multiple separate processors or multiple linked processors that may be used together, all of which may interchangeably be referred to herein as controller 150, processor 150, at least one processor 150, one or more processors 150. The controller 150 is preferably included in, or is connected to, or otherwise associated with the optical metrology device 100.

The controller 150 may also control the operation of the optical metrology device 100 and collect and analyze the data obtained from the detector arm 140. The controller 150 may analyze the data to determine one or more physical characteristics of the target sample 102 based on the data obtained.

In some implementations, optical metrology device 100 may be controlled by controller 150 to employ various metrology techniques. For example, optical metrology device 100 may be configured by the controller 150 to perform static MOKE measurements or time-resolved (TR) MOKE measurements, sometimes referred to as transient MOKE measurements. With MOKE measurements, linearly polarized light will become elliptically polarized upon reflection from a magnetized material in the target sample 102. The MOKE measurements of the target sample 102 may be useful with or without an external magnetic field produced by the magnetic element 106. The wavelength selector 133 (including one or more of the multi-wavelength generator 134 and filter 136) in the probe arm 130 may be used to select particular wavelengths to be used for the MOKE measurements and/or to use a plurality of wavelengths for the MOKE measurements, e.g., spectroscopic MOKE.

The behavior of an incident laser beam reflected from the target sample 102, which may be, e.g., an MRAM stack, changes as the applied magnetic field in the target sample 102 varies. MOKE testing may determine the orientation, coercive field, and thermal stability of the target sample 102, including the individual layers or the combined stack of layers in the target sample 102. For example, if the magnetic layers in the target sample 102 do not realign themselves in response to the application of a magnetic field (e.g., from the magnetic element 106), the magnetic layers will not switch electronically either and, thus, the measurement may be used to detect faulty devices.

Figure 2A:
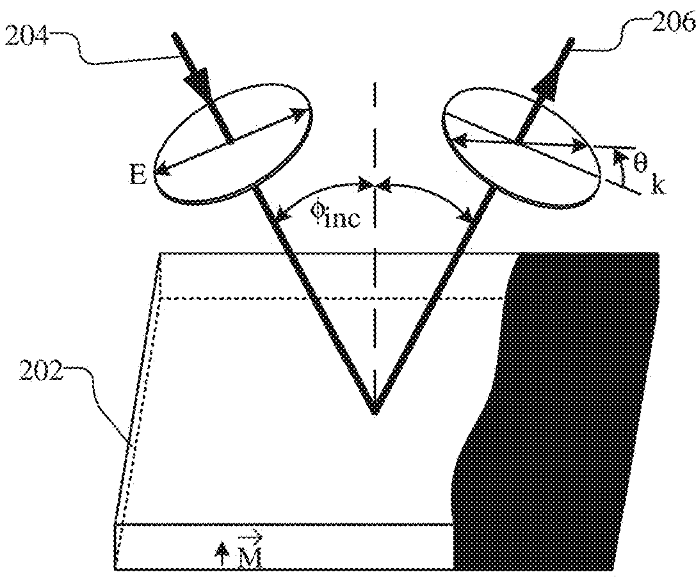
FIG. 2A illustrates a MOKE geometry and Kerr rotation $\theta_k$ produced in reflected light.
Figure 2B:
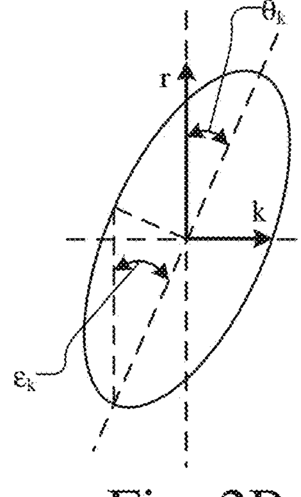
FIG. 2B illustrates the geometry of the Kerr rotation $\theta_k$ and the ellipticity $\varepsilon_k$.

FIG. 2A illustrates a MOKE geometry and Kerr rotation ($\theta_k$) produced in reflected light 206 from p-polarized incident light 204 that is incident at an angle $\phi_{inc}$ with respect to normal to the surface of the sample 202 to produce a plane of incidence. FIG. 2B illustrates the geometry of the Kerr rotation $\theta_k$ and the ellipticity $\varepsilon_k$, which are related to each other by the relation: $\theta_k + i\varepsilon_k = k/r$, in the limit k<<r, where k is the Lorentz field vector and r is the electric field vector r in the incident light.

The MOKE geometry is dependent on the orientation of the magnetization vector M with respect to the surface of the sample 202 and the plane of incidence of the light with respect to the sample surface and the plane of incidence of incident light 204. FIG. 2A, by way of example, illustrates polar geometry, in which the magnetization M lies perpendicular to the surface of the sample 202. Other types of MOKE geometry exist, including longitudinal, in which the magnetization M lies parallel to the sample surface and parallel to the plane of incidence of the incident light 204, and transverse in which the magnetization M lies parallel to the sample surface and perpendicular to the plane of incidence of the incident light 204.

The Kerr rotation ($\theta_k$) may be explained based on the interaction of the electric field (E) of the light 204 with the magnetization M of the material in the sample 202. With linearly polarized incident light 204, the electrons in the sample 202 will oscillate along the E-field of the light. For p-polarized light as illustrated in FIG. 2A, for example, the electrons will oscillate in the plane of incidence of the beam and also in the plane of the sample 202. Reflected light 206 will experience a phase change of $\pi$ with respect to the incident light 204. Thus, the direction of the electric field E in the reflected light 206 will be opposite to the direction of the electric field E in the incident light 204. With the magnetization M of the material in the sample 202, the Lorentz force ($F_{Lor}$) on the oscillating electrons will produce an additional small vibrational component that is perpendicular to the plane of incidence. Thus, the electric field E of the reflected light 206 will be the vector sum of the original electric field vector (r) and the Lorentz field vector (k). FIG. 2A illustrates that the vector sum of the reflected light 206 showing that the resultant electric field E of reflected light 206 is rotated by $\theta_k$ due to the magnetization M of the sample 202. For s polarized light, in which the electric field E is perpendicular to the plane of incidence, a similar Kerr rotation is produced for a polar effect.

The optical metrology device 100, shown in FIG. 1A, may be used to perform static MOKE measurements, e.g., using only the probe arm 130. For example, the controller 150 may cause selecting element 117 to not select the pump arm 120, i.e., to prevent pump arm 120 from producing a pump beam 121 that is incident on the target sample 102. The polarization elements 138 in the probe arm 130 may be configured to generate one or more desired polarization states of the probe pulses in probe beam 131.

The modulator 139 in the probe arm 130 may modulate the phase of the probe beam 131 with a frequency $f_{probe}$. The probe beam 131 interacts with the target sample 102, which as discussed above, magnetization in the target sample 102 will alter the polarization state in the incident light. In some implementations, the magnetic element 106 may be used to alter the magnetization of the target sample 102 during testing. The polarizing elements 142 and one or more detectors 144 and 146 may be used to detect the polarization state of the reflected beam 141 to determine the Kerr rotation ($\theta_k$). For example, the polarizing elements 142 and one or more detectors 144 and 146 may be used to detect S polarization and P polarization. The lock-in amplifier 148 may be used to demodulate the signals from the detectors 144 and 146, e.g., at the fundamental and second harmonic probe frequencies, e.g., $f_{probe}$, $2f_{probe}$.

Thus, the optical metrology device 100 may perform static MOKE using linearly polarized light that is periodically (e.g., with frequency $f_{probe}$) phase modulated, via the modulator 139 in the probe arm 130. The reflected light intensity at the detectors 144 and 146 has contributions from components at dc ($I_{dc}$), fundamental ($f_{probe}$) and second harmonic ($2f_{probe}$) of the modulation frequency. The reflected signal is demodulated using the lock-in amplifier 148 to calculate the polarization rotation (Kerr rotation angle) $\theta_k$ and the ellipticity $\varepsilon_k$ from the dc, $f_{probe}$ and $2f_{probe}$ components.

The formula for the static MOKE measurement, for example, may be written as $$\frac{I}{I_0} = (1 + 4J_2\theta_k \cos\omega t - 4J_2\varepsilon_k \sin\omega t + \ldots) \quad \text{eq. 1}$$

where $\omega$ is $2\pi f$ (the modulation frequency), $J_n$ is the $n^{th}$ Bessel function, $\varepsilon_k$ is ellipticity, and $\theta_k$ is the Kerr rotation angle. The Kerr rotation angle $\theta_k$ and the ellipticity $\varepsilon_k$ may be written as:

$$\theta_k \propto \frac{1}{4J_2} * \frac{I_{2fprobe}}{I_{dc}}, \quad \varepsilon_k \propto \frac{1}{4J_1} * \frac{I_{fprobe}}{I_{dc}} \quad \text{eq. 2}$$

Advantageously, the optical metrology device 100 may also be used to perform TR MOKE measurements using the selectable pump arm 120 along with the probe arm 130. For example, the controller 150 may cause selecting element 117 to select the pump arm 120, i.e., to produce a pump beam 121 that is incident on the target sample 102 and produces a transient response in the target sample 102. The pump beam 121 may be amplitude (intensity) modulated using modulator 126 with a frequency $f_{pump}$. The transient measurements may be performed with a resolution of, e.g., approximately 20 fs, due to the pulse duration and delay state resolution, which, for example, may be used to study spin dynamics in magnetic media in the target sample 102.

Additionally, the pulse shaper 124 in the pump arm 120 may be used to vary the pulse duration and/or phase of the incident pump beam 121 to determine the dependence of the magnetic dynamics in the target sample 102 on the pump pulse characteristics. Moreover, an adaptive algorithm may be used to define and use the optimum pulse shape of the pump beam 121 to yield desirable control over the magnetic dynamics in the target sample 102 under consideration.

The polarization elements 138 in the probe arm 130 may be configured to generate one or more desired polarization states of the probe pulses in probe beam 131. The modulator 139 in the probe arm 130 may modulate the phase of the probe beam 131 with a frequency $f_{probe}$. The probe beam 131 interacts with the target sample 102 after each pump pulse. The TRMOKE measurements may be collected as a function of the time delay between the pump beam 121 and the probe beam 131, e.g., controlled by the delay stage 122 in the pump arm 120 and/or the delay stage 132 in the probe arm 130. The magnetization in the target sample 102 will alter the polarization state in the incident light. In some implementations, the magnetic element 106 may be used to alter the magnetization of the target sample 102 during testing.

The polarizing elements 142 and one or more detectors 144 and 146 may be used to detect the polarization state of the reflected beam 141 to determine the Kerr rotation ($\theta_k$). For example, the polarizing elements 142 and one or more detectors 144 and 146 may be used to detect S polarization and P polarization. The lock-in amplifier 148 may be used to demodulate the signals from the detectors 144 and 146, e.g., as a function of some combination of pump modulation and various harmonics of the probe frequencies, such as $f_{pump} \pm f_{probe}$, $f_{pump} \pm 2f_{probe}$, etc.

Thus, the optical metrology device 100 may perform TRMOKE using a pump beam 121 that is intensity modulated with a frequency $f_{pump}$, via the modulator 126 in the pump arm 120, and using probe light that is linearly polarized light and is periodically (e.g., with frequency $f_{probe}$) phase modulated, via the modulator 139 in the probe arm 130. The reflected light intensity at the detectors 144 and 146 has contributions from components of the pump intensity ($I_{pump}$), pump frequency ($f_{pump}$), and fundamental ($f_{probe}$) and second harmonic ($2f_{probe}$) of the probe modulation frequency. The reflected signal is demodulated using the lock-in amplifier 148 to calculate the polarization rotation (Kerr rotation angle) $\theta_k$ and the ellipticity $\varepsilon_k$, as illustrated in equation 3 as an example and not as a limitation.

$$\theta_k \propto \frac{1}{4J_2} * \frac{I_{fpump \pm 2fprobe}}{I_{fpump}}, \quad \text{eq. 3}$$

$$\varepsilon_k \propto \frac{1}{4J_1} * \frac{I_{fpump \pm fprobe}}{I_{fpump}}$$

In some implementations, optical metrology device 100 may be controlled by controller 150 to perform ellipsometry measurements. With ellipsometry measurements, linearly polarized light will become elliptically polarized upon reflection from the target sample 102 due to the dielectric properties (e.g., complex refractive index or dielectric function) of the materials in the target sample 102. The optical metrology device 100 may measure at least a partial Mueller matrix, e.g., the off-diagonal elements, and/or ellipsometry parameters Ψ and Δ by measuring the change in polarization state in the reflected beam 141. In some implementations, the change in polarization may be compared to a model or library to determine characteristics of the target sample 102. Ellipsometry, for example, may be used determine characteristics of the target sample 102, such as composition, roughness, thickness (depth), crystalline nature, doping concentration, electrical conductivity, etc. The wavelength selector 133 (including one or more of the multi-wavelength generator 134 and filter 136) in the probe arm 130 may be used to select particular wavelengths to be used for the ellipsometry measurements and/or to use a plurality of wavelengths for the ellipsometry measurements, e.g., spectroscopic ellipsometry.

The optical metrology device 100 may be used to perform static ellipsometry measurements, e.g., using only the probe arm 130, e.g., with the controller 150 causing the selecting element 117 to not select the pump arm 120, i.e., to prevent pump arm 120 from producing a pump beam 121 that is incident on the target sample 102. The polarization elements 138 in the probe arm 130 may be configured to generate one or more desired polarization states of the probe pulses in probe beam 131.

The modulator 139 in the probe arm 130 may modulate the phase of the linearly polarized probe beam 131 with a frequency $f_{probe}$. The probe beam 131 interacts with the target sample 102 and the characteristics of the materials in the target sample 102 will alter the polarization state in the incident light. The polarizing elements 142 and one or more detectors 144 and 146 may be used to detect the polarization state of the reflected beam 141 to determine the ellipsometry parameters Ψ and Δ and/or adapting the Mueller matrix formalism such as looking for off-diagonal elements in some applications. For example, the polarizing elements 142 and one or more detectors 144 and 146 may be used to detect S polarization and P polarization. The lock-in amplifier 148 may be used to demodulate the signals from the detectors 144 and 146, e.g., at various harmonics, including the fundamental, second harmonic or higher harmonics of probe frequencies, e.g., $f_{probe}$, $2f_{probe}$, etc.

Thus, the optical metrology device 100 may perform static ellipsometry using linearly polarized light that is periodically (e.g., with frequency f) phase modulated, via the modulator 139 in the probe arm 130. The reflected light intensity at the detectors 144 and 146 has contributions from components at dc ($I_{dc}$), fundamental (f) and second harmonic (2f) of the modulation frequency. The reflected signal is demodulated using the lock-in amplifier 148 to calculate at least a partial Mueller matrix, e.g., the off-diagonal elements, and/or the ellipsometry parameters Ψ and Δ from the dc, f and 2f components. The ellipsometry parameters, for example, may be determined based on:

$$\frac{I_{2fprobe}}{I_{DC}} = 2J_2(\delta_0)\cos(2\Psi); \quad \text{eq. 4}$$

$$\frac{I_{fprobe}}{I_{DC}} = 2J_1(\delta_0)\sin(2\Psi)\sin(\Delta). \quad \text{eq. 5}$$

The optical metrology device 100 may further be used to perform time-resolved (TR) ellipsometry measurements using the selectable pump arm 120 along with the probe arm 130. For example, the controller 150 may cause selecting element 117 to select the pump arm 120, i.e., to produce a pump beam 121 that is incident on the target sample 102 and produces a transient response in the target sample 102. The pump beam 121 may be amplitude (intensity) modulated using modulator 126 with a frequency $f_{pump}$.

The polarization elements 138 in the probe arm 130 may be configured to generate one or more desired polarization states of the probe pulses in probe beam 131. The modulator 139 in the probe arm 130 may modulate the phase of the probe beam 131 with a frequency $f_{probe}$. The probe beam 131 interacts with the target sample 102 after each pump pulse. The TR ellipsometry measurements may be collected as a function of the time delay between the pump beam 121 and the probe beam 131, e.g., controlled by the delay stage 122 in the pump arm 120 and/or the delay stage 132 in the probe arm 130.

The characteristics of the materials in the target sample 102 will alter the polarization state in the incident light. The polarizing elements 142 and one or more detectors 144 and 146 may be used to detect the polarization state of the reflected beam 141 to determine at least a partial Mueller matrix, e.g., the off-diagonal elements, and/or the ellipsometry parameters Ψ and Δ. For example, the polarizing elements 142 and one or more detectors 144 and 146 may be used to detect S polarization and P polarization. The lock-in amplifier 148 may be used to demodulate the signals from the detectors 144 and 146, e.g., as a function of the pump frequency and some combination of harmonics of probe frequencies, such as the fundamental, second harmonic and higher probe frequencies, e.g., $f_{pump}\pm f_{probe}$, $f_{pump}\pm 2f_{probe}$, etc.

Thus, the optical metrology device 100 may perform TR ellipsometry using a pump beam 121 that is intensity modulated with a frequency $f_{pump}$, via the modulator 126 in the pump arm 120, and using probe light that is linearly polarized light and is periodically (e.g., with frequency $f_{probe}$) phase modulated, via the modulator 139 in the probe arm 130. The reflected light intensity at the detectors 144 and 146 has contributions from components of the pump intensity ($I_{pump}$), pump frequency ($f_{pump}$), and fundamental (f) and second harmonic (2f) of the probe modulation frequency. The reflected signal is demodulated using the lock-in amplifier 148 to calculate at least a partial Mueller matrix, such as the off-diagonal elements, and/or the ellipsometry parameters Ψ and Δ, e.g., based on:

$$\frac{I_{fpump\pm 2fprobe}}{I_{fpump}} \propto 2J_2(\delta_0)\cos(2\Psi); \quad \text{eq. 6}$$

$$\frac{I_{fpump\pm fprobe}}{I_{fpump}} \propto 2J_1(\delta_0)\sin(2\Psi)\sin(\Delta). \quad \text{eq. 7}$$

In some implementations, optical metrology device 100 may be controlled by controller 150 to perform opto-acoustic measurements. The opto-acoustic measurements may be, e.g., picosecond ultrasonic measurements that may be used to measure depth resolved measurement of the non-uniformities in the target sample 102. The opto-acoustic measurements, for example, uses a pump beam 121 to produce a transient response in the target sample 102, e.g., a transducer layer, such as a metal layer, in the target sample 102 absorbs the pump pulse energy and launches a sound wave vertically into the target sample 102. The propagating sound wave interacts with the probe beam 131 via piezo-reflectance response, and is reflected. The light reflected from the propagating sound wave will interfere with the light reflecting from the top surface of the target sample 102 resulting in a characteristic oscillatory time-evolved signal, i.e., coherent Brillouin scattering. The period of oscillation reveals information regarding speed of sound and elastic modulus within the target sample 102. The depth-resolved oscillation period may be used to extract the speed of sound and Young's modulus at various depths in the target sample 102, which may be used to provide insight into the presence and location of non-uniformities or thickness measurements of opaque films.

The optical metrology device 100 may perform opto-acoustic measurements using the selectable pump arm 120 along with the probe arm 130. For example, the controller 150 may cause selecting element 117 to select the pump arm 120, i.e., to produce a pump beam 121 that is incident on the target sample 102 and produces a transient response in the target sample 102. The pump beam 121 may be amplitude (intensity) modulated using modulator 126 with a frequency $f_{pump}$.

The probe arm 130 produces probe pulses in the probe beam 131, which may be, but need not be polarized by polarization elements 138 in the probe arm 130. Moreover, the probe beam 131 need not be phase modulated by the modulator 139. In some implementations, the probe beam may be amplitude (intensity) modulated by the modulator 139. The probe beam 131 interacts with the target sample 102 after each pump pulse. The opto-acoustic measurements may be collected as a function of the time delay between the pump beam 121 and the probe beam 131, e.g., controlled by the delay stage 122 in the pump arm 120 and/or the delay stage 132 in the probe arm 130.

Figure 3:
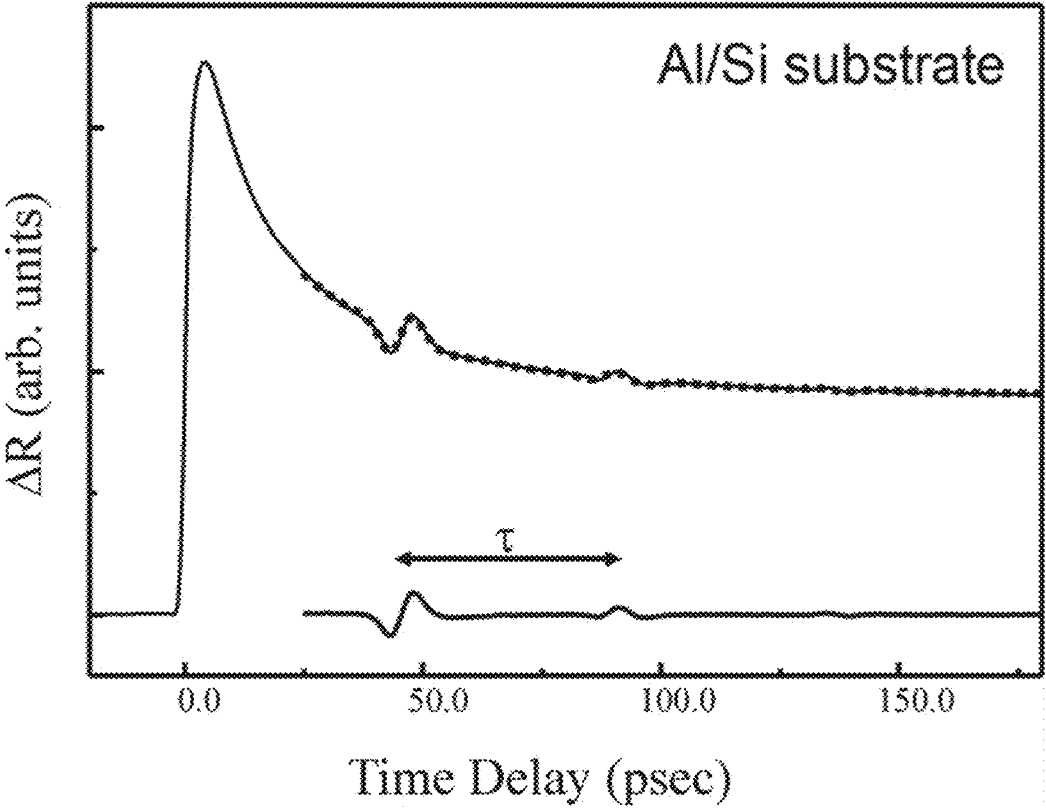
FIG. 3 illustrates a graph showing a change in reflectance with respect to time delay in an opto-acoustic measurement.

The characteristics of the materials, including types of material, thickness, and non-uniformities, in the target sample 102 will alter the propagation time of the sound wave, and may be measured based on the reflected beam 141. The detector arm 140 may detect the changes in reflection or surface deformation in the reflected beam 141, e.g., using a detector 144 with respect to the time delay. FIG. 3, by way of example, illustrates a graph showing a change in reflectance ΔR in arbitrary units with respect to time delay (psec) that may be measured by the optical metrology device 100 operating in opto-acoustic measurement mode. By way of example, the thickness of the target sample 102 may be measured based on:

$$\text{Thickness} = \frac{\tau * v_{sound}}{2} \quad \text{eq. 8}$$

where $\tau$ is the echo arrival time and $v_{sound}$ is the speed of sound in the material of the target sample 102.

Figure 1B:
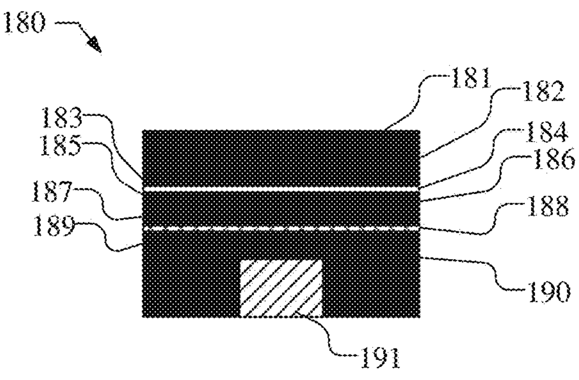
FIG. 1B illustrates a side view of a portion of a magnetic random access memory (MRAM) device that is an example of a target sample that may be measured by the optical metrology device of FIG. 1A.

FIG. 1B illustrates a side view of a portion of an MRAM device 180 that is an example of a target sample 102 that may be measured by the optical metrology device 100. The MRAM device 180 by way of example, may include a hard mask layer 181, cap layer (top electrode) 182, a CoFeB layers 183 and 185 with an intervening MgO layer 184, a Ta spacer 186, $[Co(x)/Pt(y)]_n$ multilayers 187 and 189 with an intervening Ru or Ir layer 188, a seed layer 190, and a bottom electrode 191. Acoustic and ellipsometry measurements may be used, for example, to measure the thickness of the bottom electrode 191 or thickness of the metal in an MTJ stack. Static MOKE may be used, for example, to measure magnetic stack deposition, annealing and magnetization. Subtle changes in the free and pinned layers may be measured for optimum magnetization state. For example, with tunnel magnetoresistance (TMR), the resistance of the MTJ depends on relative orientation of the magnetic layers, which is critical for reading. In another example, with spin transfer torque (STT), the spin angular momentum transfer between magnetic layers resulting in torque on free layer, which is critical for writing. Static MOKE may be used to measure the magnetization to achieve these characteristics. Transient MOKE, on the other hand, may be used for characterization of magnetization dynamics, e.g., to study the speed of magnetic writing and reading. For example, magnetic switching may occur in the picosecond timescale. Transient MOKE may be used to study the control of individual bits at sub-ns timescale in high density magnetic memory. With the use of the optical metrology device 100, the various characteristics, such as those described above, may be measured.

Figure 4:
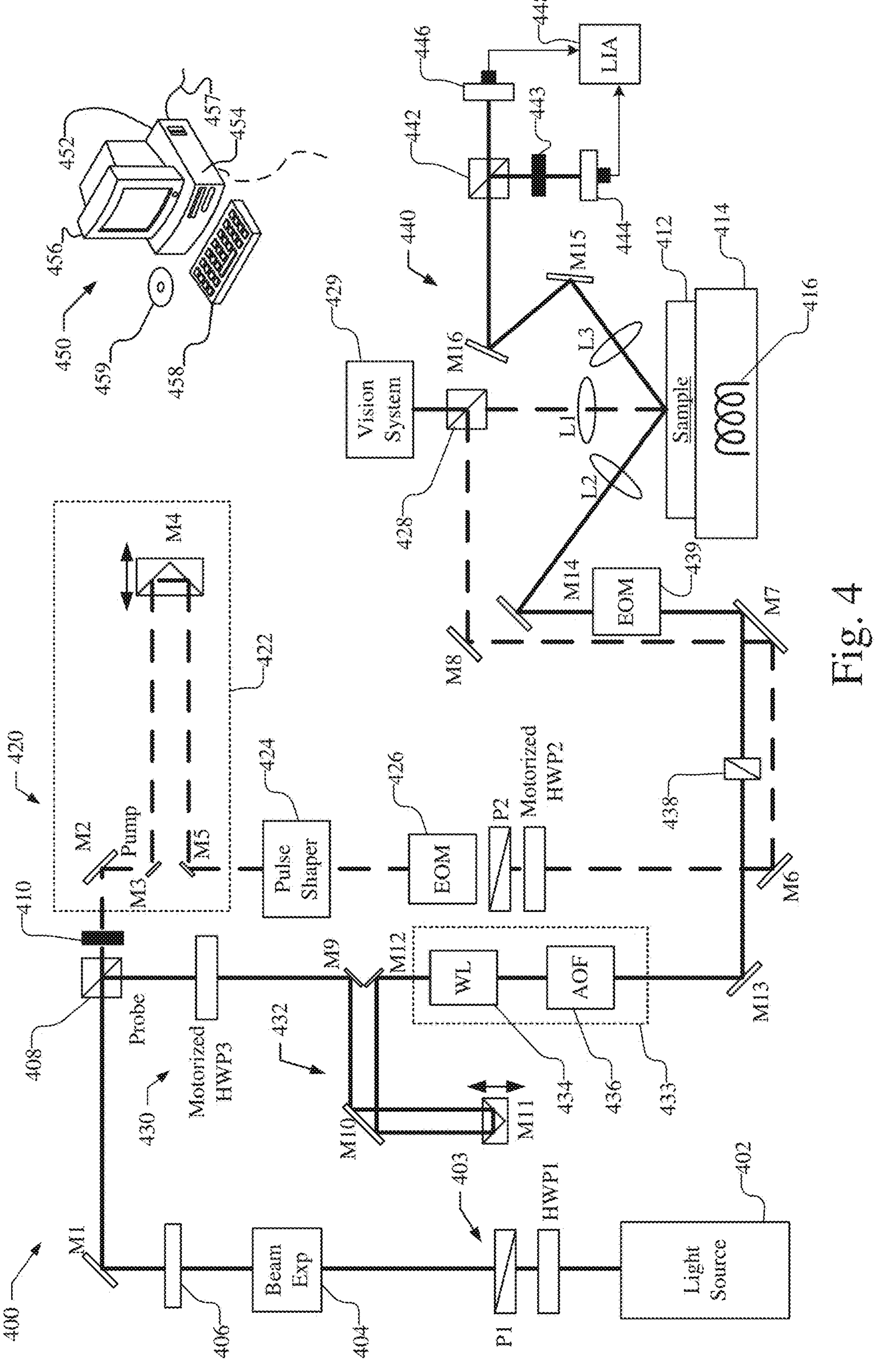
FIG. 4 illustrates a more detailed schematic representation of an optical metrology device in one implementation of the optical metrology device illustrated in FIG. 1A.

FIG. 4 illustrates a schematic representation of an optical metrology device 400, which illustrates one implementation of the optical metrology device 100 shown in FIG. 1A. It should be understood that the optical metrology device 400 may include components and subsystems in addition to those illustrated in FIG. 4, such as beam management and conditioning components, such as beam expanders, collimators, polarizers, half-wave plates, etc., as well as a beam power detector, and focus sensor, etc. Those having skill in the art will appreciate variations of the optical metrology device 400 of FIG. 4 that would still be suitable to carry out the metrology techniques described herein. Moreover, it should be understood that certain components illustrated in FIG. 4 may not be included in the optical metrology device 400 if the specific component are unnecessary for performing desired metrology techniques described herein. For example, in some implementations, the pump arm 420 may be excluded from the optical metrology device 400 if transient or time resolved measurements are not desired, while in other implementations, the shutter 410 (or pump arm 420 selecting component) may be excluded from the optical metrology device 400 if static, e.g., non-transient or non-time resolved measurements are not desired. Similarly, one or more of the pump delay stage 422, pulse shaper 424, probe delay stage 432, wavelength selector 433 (e.g., one or both of the multi-wavelength generator 434 and filter 436, such as a dichroic mirror, laser line filter, notch filters, etc.), or other components, as will be understood by those skilled in the art, may be excluded from the optical metrology device 400 if unnecessary for desired measurements.

As illustrated, light may be produced from a light source 402, such as a 510-535 nm range 50-400 fs, 20-150 MHz laser that produces a pulsed light beam. The light may be directed through an intensity control 403, including a half wave plate HWP1 and a polarizer P1. The light may pass through a beam expander 404, which may include a series of lenses that expands the beam. The light may pass through a chopper 406, which may be used for intensity control of the pulsed light beam. In some implementations, instead of chopper 406, another intensity modulator, such as an EOM or AOM may be used. The light source 402, intensity control 403, beam expander 404, and chopper 406 (if present) may be used as the pulsed light source 110 illustrated in FIG. 1A.

The pulsed light beam is directed to a beam splitter 408 by a mirror M1. The beam splitter 408, for example, may be used as the beam splitter 115 illustrated in FIG. 1A. The beam splitter may be a non-polarizing beam splitter that separates the pulsed light beam and directs a portion (e.g., 50%) to a selectable pump arm 420 (which may be used as the pump arm 120 in FIG. 1A), and directs another portion (e.g., 50%) to a probe arm 430 (which may be used as the probe arm 130 in FIG. 1A).

A shutter 410 may be used to select or exclude the pump arm 120 from measurements, e.g., by opening to allow the pulsed light beam to pass to the pump arm 120 or by closing to prevent the pulsed light beam to pass to the pump arm 120. The shutter 410, by way of example, may be used as the selecting element 117 in FIG. 1A. The shutter 410 may be replaced with a flip mirror or other movable element, or by an electrically controlled elements, such as an electrochromic optical switch, which may become opaque with the application of a current or voltage. In some implementations, the shutter 410 may be replaced with a polarizing element (e.g., polarizer P1) before the beam splitter 408 and the beam splitter may be a polarizing beam splitter to select whether the pulsed light beam is provided to the pump arm 120 and the polarizer P1 may be controlled to produce a polarization state in the pulsed light beam that is either directed to both the pump arm 420 and the probe arm 430 or to only the probe arm 430.

The pump arm 420 includes a variable delay stage 422, which is illustrated as including a number of mirrors, M2, M3, M4, and M5, where the mirror M4 is movable, via a piezoelectric motor, to alter the length of the optical path to control the delay of the pulses in the pump beam produced by pump arm 420 to vary the time delay between pulses in the pump beam and the probe beam.

A pulse shaper 424 receives the pulsed light beam and varies at least one of a duration, phase, or both of the pulses in the pulsed light beam in the pump beam. The pulse shaper 424, for example, may be a spatial light modulator or an acousto-optic modulator. For example, a spatial light modulator, such as a liquid crystal SLM, manufactured by Jenoptik, may be used, or an acousto-optic modulator, such as KD*P crystal based EOM, manufactured by Conoptics, may be used.

The pump beam passes through an EOM 426, such as a KD*P crystal based EOM, manufactured by Conoptics. The pump beam may further pass through a polarizer P2 and half wave plate HWP2 and is directed to the target sample 412 via mirrors M6, M7, M8, beam splitter 428 and lens L1. The lens L1 may include one or more reflective or refractive lenses or combination thereof. The lens L1 may direct the pump beam to be normally incident on the target sample 412. In some implementations, the pump beam may have a non-normal angle of incidence, e.g., between normal and 70° incidence angle.

A vision system 429 may focus on the target sample 412 via the beam splitter 428 and lens L1 and may be used for positioning the target sample 412.

The probe arm 430 may include a motorized half wave plate HWP3 before a variable delay stage 432, which is illustrated as including a number of mirrors, M9, M10, M11, and M12, where the mirror M11 is movable, via a piezoelectric motor, to alter the length of the optical path to control the delay of the pulses in the probe beam produced by probe arm 430 to vary the time delay between pulses in the pump beam and the probe beam.

The probe arm 430 may include a wavelength selector 433 that may be used to select one or more wavelengths to be used in the probe beam for measurement of the target sample 412. The wavelength selector 433, for example, may include a multi-wavelength generator 434 that receives the pulsed light beam 111, which is narrowband, and spectrally broadens the pulsed light beam to produce the probe beam. The multi-wavelength generator 434, for example, may be a supercontinuum generator, such as multiple harmonic generator, e.g., a DBO or photonic crystal fibers that receive a single or narrowband of wavelengths and produce multiple wavelengths in a continuous or dis-continuous spectrum wavelengths for the probe beam. For example, a DBO or photonic crystal fibers may be used. The multi-wavelength generator 434 enables an ability to increase the wavelengths of the probe beam, e.g., from visible to near infrared spectral range, which may be continuous or discontinuous wavelengths, and which may be used for spectroscopic measurement of the target sample 412 or may be filtered to select a particular wavelength or narrowband of wavelengths for measurement of the target sample 412. The wavelength selector 433, in some implementations, may further include a filter 436, such as an acousto-optic filter, that when used with the multi-wavelength generator 434 enables an ability to select one or more specific wavelengths to be included in the probe beam, e.g., from visible to near infrared spectral range to be used for measuring a target sample 412.

The probe arm 430, for example, may include one or more polarization elements 438 (e.g., polarizer(s) and/or waveplate(s)) that produce one or more polarization states and optional phase shifts, which may be configurable, e.g., rotatable, to produce a desired polarization state in the probe beam. The probe arm 430 may further include an EOM 439 to modulate the amplitude and/or the phase of the probe beam. The EOM 439 may modulate the amplitude (intensity) of the polarized probe pulses in the probe beam. For example, the EOM 439 may be a KD*P crystal based EOM, manufactured by Conoptics. The EOM 439 may periodically phase modulate polarized probe pulses in the probe beam.

The probe beam produced by probe arm 430 is directed to the target sample 412 via mirrors M13, M7, M14 and lens L2. The lens L2 may include one or more reflective or refractive lenses or combination thereof. The lens L2 directs the probe beam to be obliquely incident on the target sample 412.

The detector arm 140 receives the reflected beam from the target sample 412 via lens L3 and mirrors M15 and M16. The lens L3 may include one or more reflective or refractive lenses or combination thereof. The detector arm 140 may include a beam splitter 442 that directs a portion of the reflected light towards a first detector 444 and directs another portion of the reflected light towards a second detector 446. For example, the detectors 444 and 446 may be single photodetectors, such as Si-based photodetector produced by Thorlabs. In some implementations, one or more polarizing elements may be located in the detector arm 440, which may operate as an analyzer to select the polarization state of the reflected light that is detected. The first detector 444 and the second detector 446 may receive orthogonal polarization states of the reflected light. For example, in some implementations, the beam splitter 442 may be a polarizing beam splitter and may direct the reflected light to the detectors 444 and 446 based on the polarization state of the reflected light, e.g., with the first detector 444 receiving the S polarization state of the reflected light and the second detector 446 receiving the P polarization state of the reflected light. In some implementations, the beam splitter 442 may be non-polarizing, and one or more polarizing elements may be located in the detector arm 440 to select the polarization state of the reflected light that is received by detectors 444 and 446. The polarizing element, for example, may be rotatable so that multiple polarization states may be detected if desired. Moreover, in some implementations, a shutter 443 (or other selecting element, such as a flip mirror or other movable element, or an electrically controlled elements, such as an electrochromic optical switch) may be located before detector 444 to prevent the detection of reflected light by the detector 444 when only a single detector 446 is desired for measurements.

The one or more detectors 444 and/or 446 may be connected to a lock-in amplifier 448 that receives the signals from the detectors 444 and 446 that are generated based on the received reflected probe pulses in the reflected beam from the target sample 412 and demodulates the signals based on the dc frequency component produced by the light source 402, and the modulation frequencies produced by EOM 439 in the probe arm 430 and the EOM 426 in the pump arm 420, if used.

As illustrated, the optical metrology device 400 may additionally include a stage 414 that includes a chuck for holding the target sample 412 and actuators for moving the target sample 412 to a desired positioning system. The stage 414, for example, may be capable of horizontal motion in either Cartesian (i.e., X and Y) coordinates, or Polar (i.e., R and θ) coordinates or some combination of the two. The stage may also be capable of vertical motion along the Z coordinate. Additionally, one or more magnetic elements 416, e.g., electromagnets, may be included in the stage 414 or external to the stage 414, and may be used to apply a magnetic field to the target sample 412 for measurements, such as static MOKE and/or TR MOKE measurements.

The detectors 444, 446, e.g., or the lock-in amplifier 448, as well as other components of the optical metrology device 400, such as the light source 402, shutter 410, pump variable delay stage 422, pulse shaper 424, EOM 426, probe variable delay stage 432, wavelength selector 433, polarizer 438, EOM 439, shutter 443 (if present), stage 414, and the one or more magnetic elements 416, may be coupled to at least one controller 450, such as a workstation, a personal computer, central processing unit or other adequate computer system, or multiple systems. It should be understood that the controller 450 includes one or more processing units 452 that may be separate or linked processors, and controller 450 may be referred to herein sometimes as a processor 450, at least one processor 450, one or more processors 450, etc. The controller 450 is preferably included in, or is connected to, or otherwise associated with optical metrology device 400. The controller 450, for example, may control the positioning of the target sample 412, e.g., by controlling movement of the stage 414 on which the target sample 412 is held. The controller 450 may further control the operation of a chuck on the stage 414 used to hold or release the target sample 412. The controller 450 may also collect and analyze the data obtained from the detectors 444, 446. The controller 450 may analyze the data to determine one or more physical characteristics of the sample based on static MOKE, TR MOKE, ellipsometry, TR ellipsometry, spectroscopic ellipsometry, opto-acoustic metrology, etc., as discussed herein. In some implementations, the measured data may be obtained and compared to a modeled data, which may be stored in a library or obtained in real time. Parameters of the model may be varied, and modeled data compared to the measured data, e.g., in a linear regression process, until a good fit is achieved between the modeled data and the measured data, at which time the modeled parameters are determined to be the characteristics of the target sample 412.

The controller 450 includes at least one processing unit 452 and memory 454, as well as a user interface including e.g., a display 456 and input devices 458. A non-transitory computer-usable storage medium 459 having computer-readable program code embodied may be used by the at least one processor 452 for causing the at least one processor 452 to control the optical metrology device 400 and to perform the measurement functions and analysis described herein. The data structures and software code for automatically implementing one or more acts described in this detailed description can be implemented by one of ordinary skill in the art in light of the present disclosure and stored, e.g., on a computer-usable storage medium 459, which may be any device or medium that can store code and/or data for use by a computer system such as processing unit 452. The computer-usable storage medium 459 may be, but is not limited to, flash drive, magnetic and optical storage devices such as disk drives, magnetic tape, compact discs, and DVDs (digital versatile discs or digital video discs). A communication port 457 may also be used to receive instructions that may be stored on memory 454 and used to program the processor 450 to perform any one or more of the functions described herein and may represent any type of communication connection, such as to the internet or any other computer network. The communication port 457 may further export signals, e.g., with measurement results and/or instructions, to another system, such as external process tools, in a feed forward or feedback process in order to adjust a process parameter associated with a fabrication process step of the samples based on the measurement results. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described. The results from the analysis of the data may be stored, e.g., in memory 454 associated with the sample and/or provided to a user, e.g., via display 456, an alarm, data set, or other output device. Moreover, the results from the analysis may be fed back to the process equipment to adjust the appropriate patterning step to compensate for any detected variances in the processing.

Figure 5:
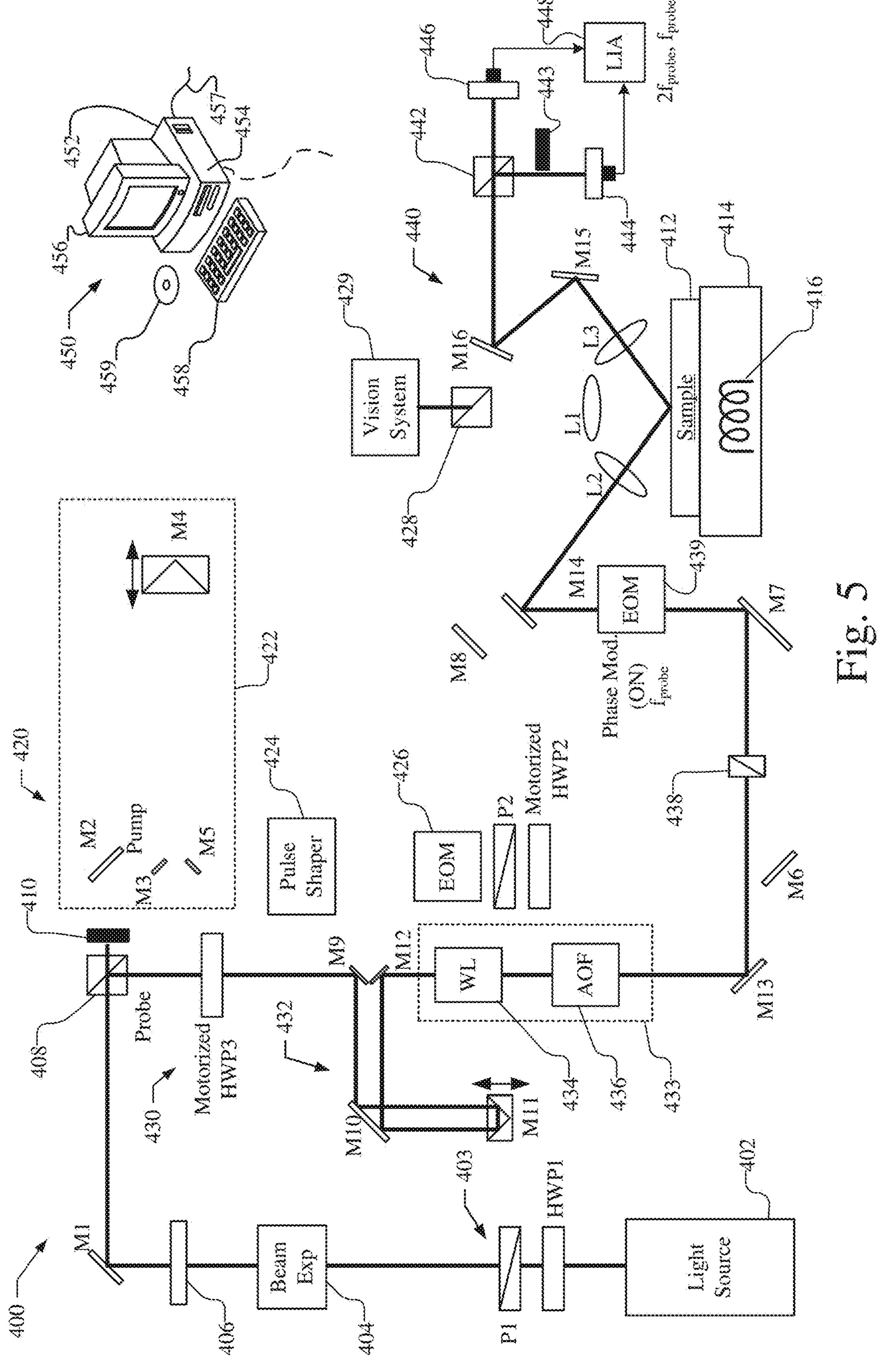
FIG. 5 illustrates the optical metrology device from FIG. 4 operating in a static MOKE metrology mode.

FIG. 5, by way of example, illustrates the optical metrology device 400 configured to perform static MOKE measurements, e.g., using only the probe arm 430. For example, as illustrated, the shutter 410 is configured to not select the pump arm 420 preventing the pump arm 420 from producing a pump beam. The wavelength selector 433 may be configured to generate a desired wavelength or a plurality of continuous or discontinuous wavelengths in the probe beam, e.g., using the multi-wavelength generator 434 and filter 436. The polarizer 438 in the probe arm 430 is configured to generate a desired polarization state, e.g., 45°, in the probe pulses in probe beam. The EOM 439 is configured to phase modulate the probe beam, e.g., with a frequency $f_{probe}$. In some implementations, the magnetic element 416 may be used to alter the magnetization of the target sample 102 during testing, e.g., by changing the magnetization before a number of measurements. The shutter 443 is configured to allow use of both detectors 444 and 446. The polarizing beam splitter 442 (or one or more polarizers if used) and detectors 444 and 446 may be used to detect the polarization state of the reflected beam to determine the Kerr rotation ($\theta_k$), as discussed above. For example, the S polarization and P polarization states may be detected by detectors 444 and 446, and the lock-in amplifier 448 may be used to demodulate the signals from the detectors 444 and 446, e.g., at some combination of harmonics of probe frequencies, such as the fundamental, second harmonic and higher probe frequencies, e.g., $f_{pump}+f_{probe}$, $f_{pump}+2f_{probe}$, etc. The optical metrology device 400 may use the detected intensities with components at dc ($I_{dc}$), fundamental ($f_{probe}$) and second harmonic ($2f_{probe}$) of the modulation frequency to determine the polarization rotation (Kerr rotation angle) $\theta_k$ and the ellipticity Ex from the dc, $f_{probe}$ and $2f_{probe}$ components as illustrated in equation 2.

Figure 6:
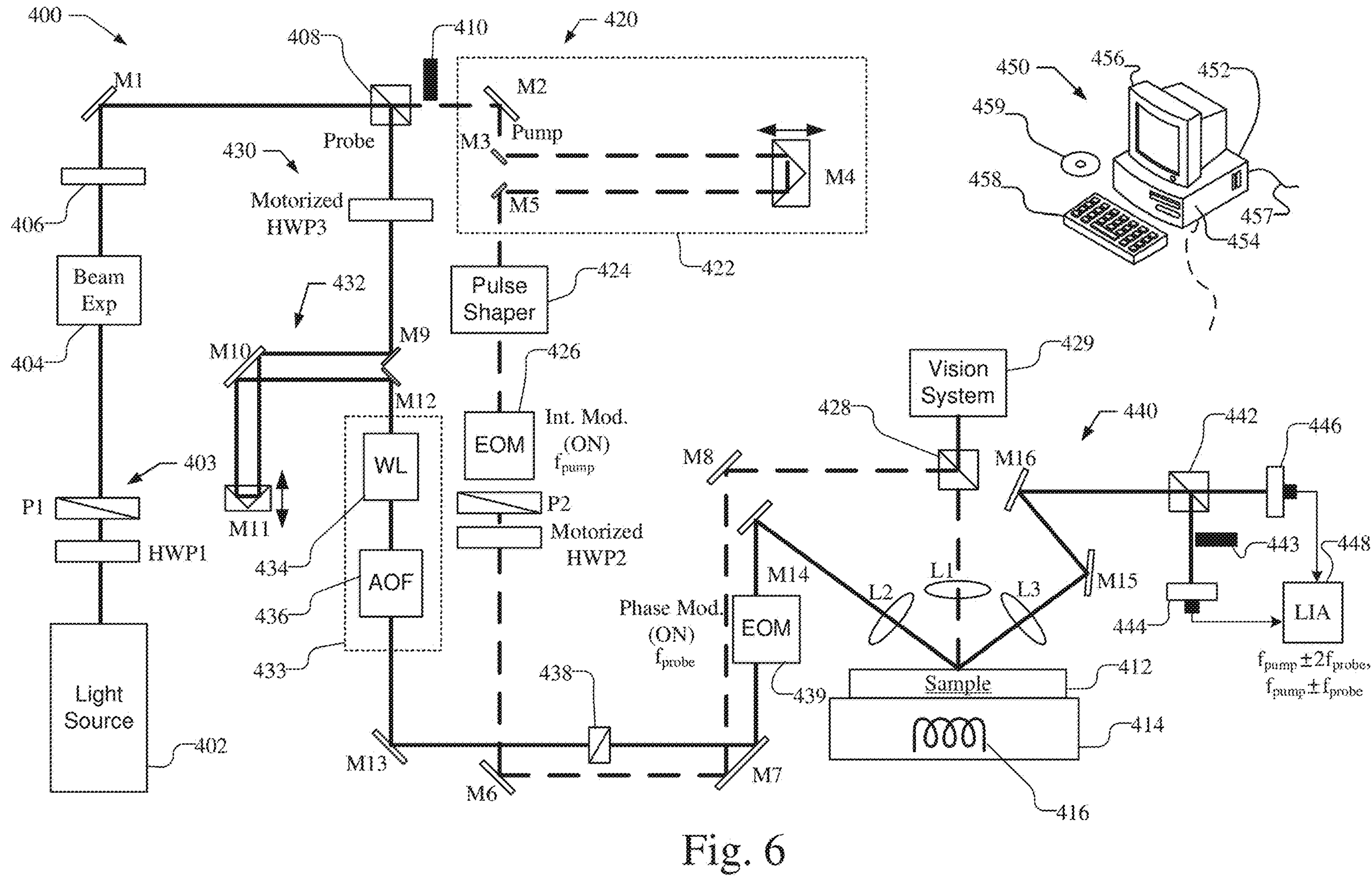
FIG. 6 illustrates the optical metrology device from FIG. 4 operating in a TR MOKE metrology mode.

FIG. 6, by way of example, illustrates the optical metrology device 400 configured to perform TR MOKE measurements, e.g., using both the pump arm 420 and the probe arm 430. For example, as illustrated, the shutter 410 is configured to select the pump arm 420 to produce a pump beam that is incident on the target sample 412 and produces a transient response in the target sample 412. The pump beam may be configured to induce magnetization dynamics in the target sample 412, e.g., using femtosecond pump laser pulses. The pulse shaper 424 may be used to vary the pulse duration and/or phase of the incident pump beam to determine the dependence of the magnetic dynamics in the target sample 412 on the pump pulse characteristics. Moreover, an adaptive algorithm may be used to define and use the optimum pulse shape of the pump beam to yield desirable control over the magnetic dynamics in the target sample 412 under consideration, e.g., by altering the pulse shape in the pump beam until a strongest response is detected. The EOM 426 may modulate the amplitude (intensity) of the pump beam with a frequency $f_{pump}$.

The wavelength selector 433 in the probe arm 430 may be configured to generate a desired wavelength or a plurality of continuous or discontinuous wavelengths in the probe beam, e.g., using the multi-wavelength generator 434 and filter 436. The polarizer 438 in the probe arm 430 is configured to generate a desired polarization state, e.g., 45°, in the probe pulses in probe beam. The EOM 439 is configured to phase modulate the probe beam, e.g., with a frequency $f_{probe}$. In some implementations, the magnetic element 416 may be used to alter the magnetization of the target sample 412 during testing, e.g., by changing the magnetization before a number of measurements, and/or magnetization of the target sample 412 may be induced with pump pulses. The shutter 443 is configured to allow use of both detectors 444 and 446. The polarizing beam splitter 442 (or one or more polarizers if used) and detectors 444 and 446 may be used to detect the polarization state of the reflected beam to determine the Kerr rotation ($\theta_k$), as discussed above. For example, the S polarization and P polarization states may be detected by detectors 444 and 446, and the lock-in amplifier 448 may be used to demodulate the signals from the detectors 444 and 446, e.g., at some combination of harmonics of probe frequencies, such as the fundamental, second harmonic and higher probe frequencies, e.g., $f_{pump}+f_{probe}$, $f_{pump}\pm 2f_{probe}$, etc. The optical metrology device 400 may use the detected intensities with components at components of the pump intensity ($I_{pump}$), pump frequency ($f_{pump}$), and fundamental ($f_{probe}$) and second harmonic ($2f_{probe}$) of the probe modulation frequency to determine the polarization rotation (Kerr rotation angle) $\theta_k$ and the ellipticity $\varepsilon_k$ from the dc, f and 2f components as illustrated in equation 3.

Figure 7:
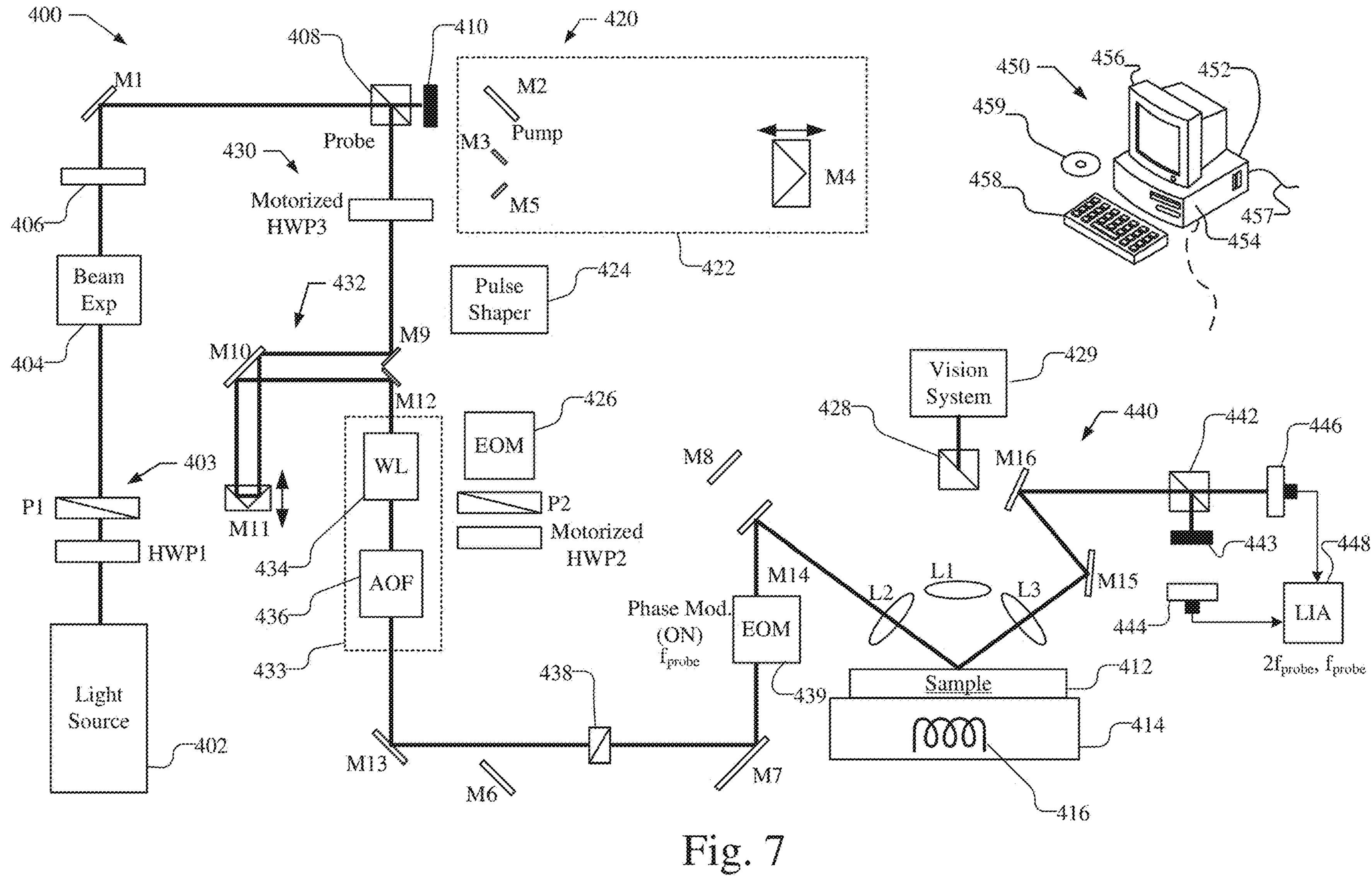
FIG. 7 illustrates the optical metrology device from FIG. 4 operating in a static ellipsometry metrology mode.

FIG. 7, by way of example, illustrates the optical metrology device 400 configured to perform ellipsometry measurements, e.g., using only the probe arm 430. For example, as illustrated, the shutter 410 is configured to not select the pump arm 420 preventing the pump arm 420 from producing a pump beam. The wavelength selector 433 may be configured to generate a desired wavelength or a plurality of continuous or discontinuous wavelengths in the probe beam, e.g., using the multi-wavelength generator 434 and filter 436. The polarizer 438 in the probe arm 430 is configured to generate a desired polarization state, e.g., 45°, in the probe pulses in probe beam. In some implementations, the polarizer 438 may be rotated to produce different polarization states. The linearly polarized light from polarizer 438 is phase modulated by the EOM 439, e.g., with a frequency $f_{probe}$. The shutter 443 may be configured prevent reflected light from being received by detectors 444. The polarizing beam splitter 442 (or one or more polarizers if used) operates as an analyzer and directs the reflected light from the target sample 412 to the detector 446, which detects the intensity of the reflected light at the selected polarization state. The lock-in amplifier 448 demodulate the signals from the detector 444, e.g., at some combination of harmonics of probe frequencies, such as the fundamental, second harmonic and higher probe frequencies, e.g., $f_{probe}$, $2f_{probe}$, etc. The optical metrology device 400 may use the detected intensities with components at dc ($I_{dc}$), fundamental ($f_{probe}$) and second harmonic ($2f_{probe}$) of the modulation frequency to determine at least a partial Mueller matrix, e.g., the off-diagonal elements, and/or the ellipsometry parameters $\Psi$ and $\Delta$ from the dc, $f_{probe}$ and $2f_{probe}$ components as illustrated in equations 4 and 5.

Figure 8:
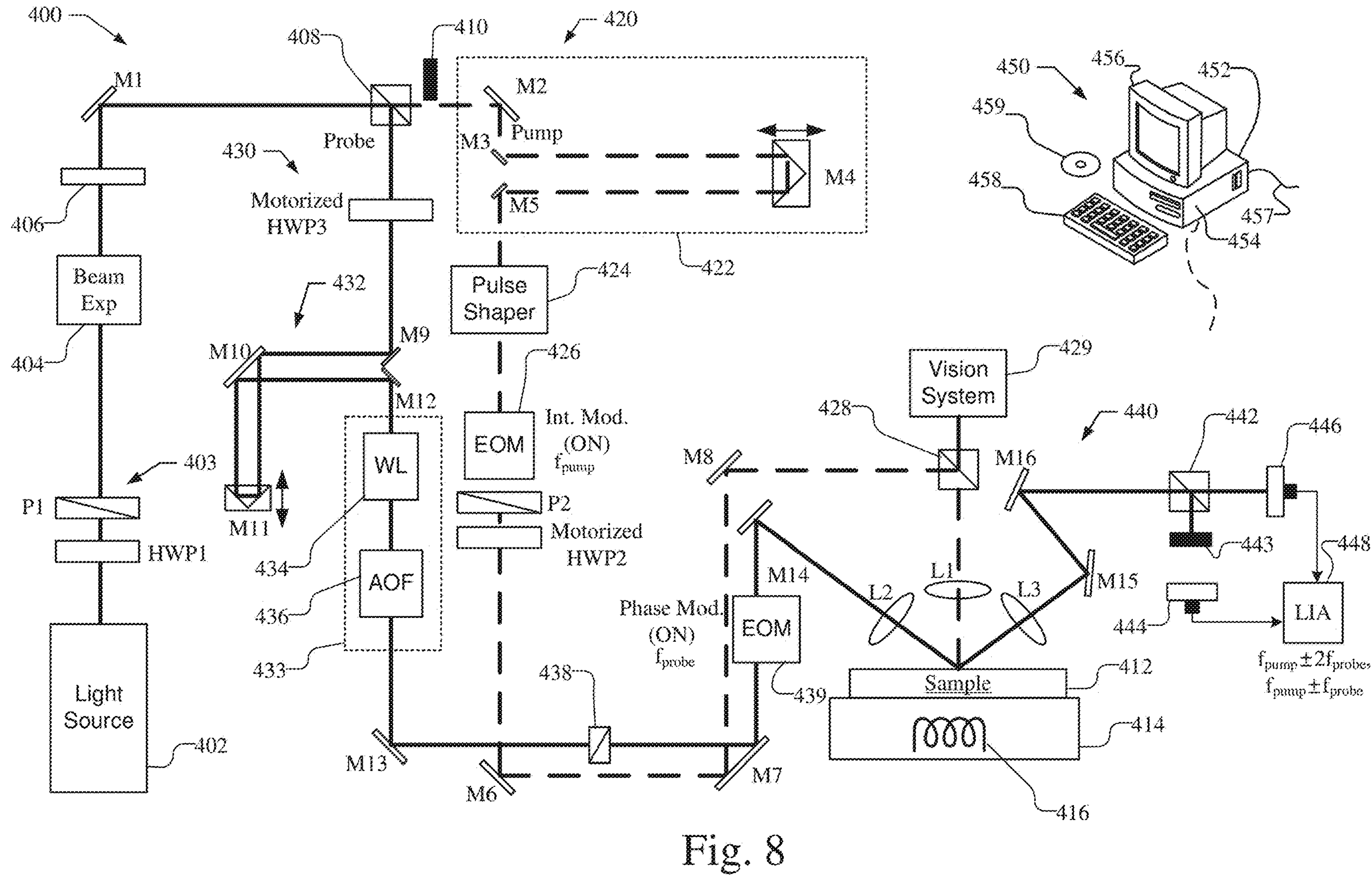
FIG. 8 illustrates the optical metrology device from FIG. 4 operating in a TR ellipsometry metrology mode.

FIG. 8, by way of example, illustrates the optical metrology device 400 configured to perform TR ellipsometry measurements, e.g., using both the pump arm 420 and the probe arm 430. For example, as illustrated, the shutter 410 is configured to select the pump arm 420 to produce a pump beam that is incident on the target sample 412 and produces a transient response in the target sample 412. The EOM 426 may modulate the amplitude (intensity) of the pump beam with a frequency $f_{pump}$.

The wavelength selector 433 in the probe arm 430 may be configured to generate a desired wavelength or a plurality of continuous or discontinuous wavelengths in the probe beam, e.g., using the multi-wavelength generator 434 and filter 436. The polarizer 438 in the probe arm 430 is configured to generate a desired polarization state, e.g., 45°, in the probe pulses in probe beam. In some implementations, the polarizer 438 may be rotated to produce different polarization states. The linearly polarized light from polarizer 438 is phase modulated by the EOM 439, e.g., with a frequency $f_{probe}$. The shutter 443 may be configured prevent reflected light from being received by detectors 444. The polarizing beam splitter 442 (or one or more polarizers if used) operates as an analyzer and directs the reflected light from the target sample 412 to the detector 446, which detects the intensity of the reflected light at the selected polarization state. The lock-in amplifier 448 may be used to demodulate the signals from the detectors 444 and 446, e.g., at some combination of harmonics of probe frequencies, such as the fundamental, second harmonic and higher probe frequencies, e.g., $f_{pump}+f_{probe}$, $f_{pump}+2f_{probe}$, etc. The optical metrology device 400 may use the detected intensities with components at components of the pump intensity ($I_{pump}$), pump frequency ($f_{pump}$), and fundamental ($f_{probe}$) and second harmonic ($2f_{probe}$) of the probe modulation frequency to determine at least a partial Mueller matrix, e.g., the off-diagonal elements, and/or the ellipsometry parameters Ψ and Δ, as illustrated in equations 6 and 7.

Figure 9:
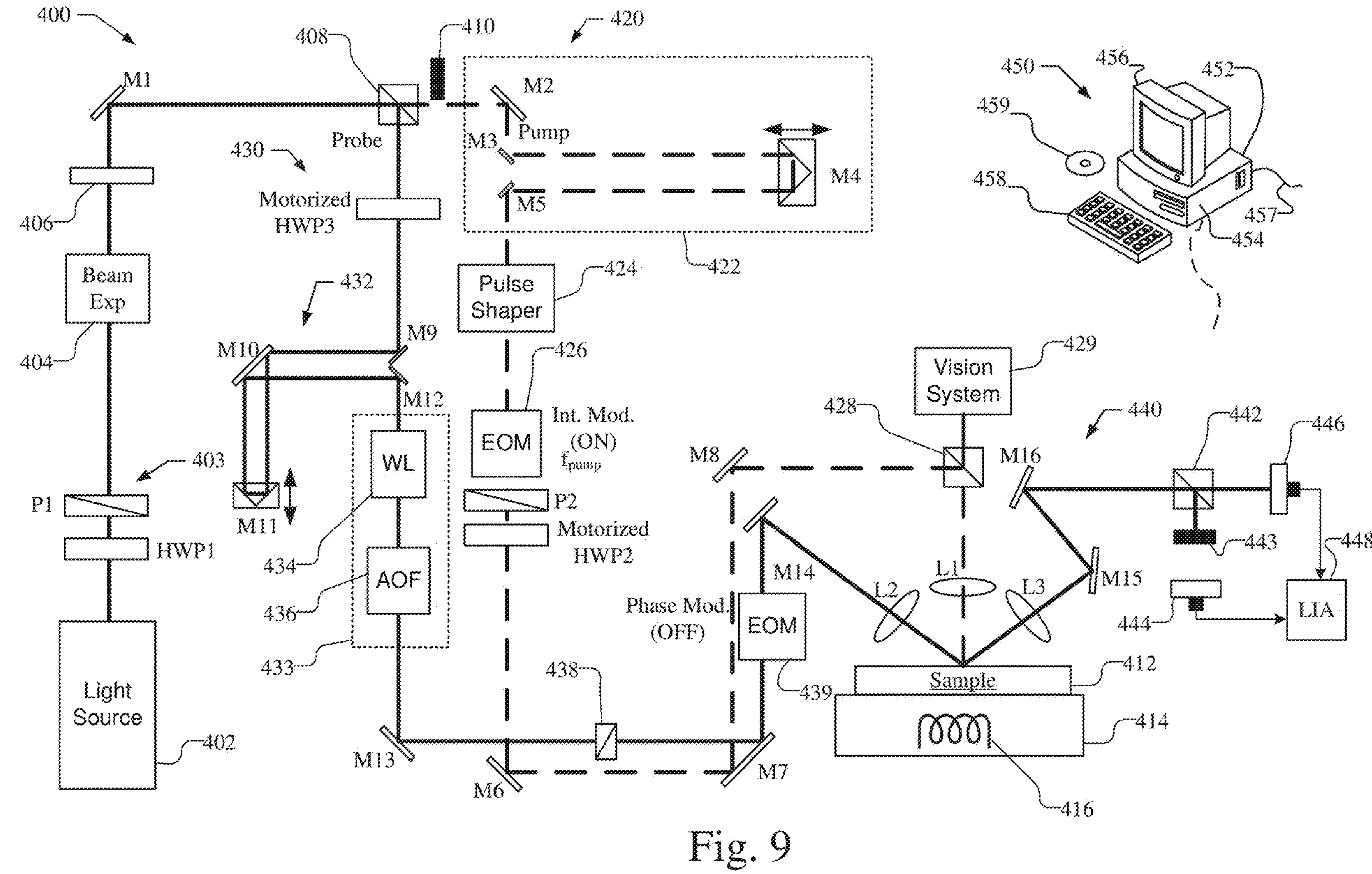
FIG. 9 illustrates the optical metrology device from FIG. 4 operating in an opto-acoustic metrology mode.

FIG. 9, by way of example, illustrates the optical metrology device 400 configured to perform opto-acoustic measurements, e.g., using both the pump arm 420 and the probe arm 430. For example, as illustrated, the shutter 410 is configured to select the pump arm 420 to produce a pump beam that is incident on the target sample 412 and produces a transient response in the target sample 412. The variable delay stage 422 may be controlled to generate various delays between the pump beam and the probe beam so that the opto-acoustic measurements may be collected as a function of the time delay between the pump beam and the probe beam. The EOM 426 may modulate the amplitude (intensity) of the pump beam with a frequency $f_{pump}$.

The wavelength selector 433 in the probe arm 430 may be configured to generate a desired wavelength or a plurality of continuous or discontinuous wavelengths in the probe beam, e.g., using the multi-wavelength generator 434 and filter 436. The polarizer 438 in the probe arm 430 is configured to generate a desired polarization state, e.g., 0°, in the probe pulses in probe beam. The shutter 443 may be configured prevent reflected light from being received by detectors 444. The beam splitter 442 directs the reflected light from the target sample 412 to the detector 446, which detects the changes in reflection in the reflected beam with respect to the time delay. The change in reflectance with respect to time delay may be used to determine various characteristics of the target sample 412, such as thickness as illustrated in equation 8.

Figure 10:
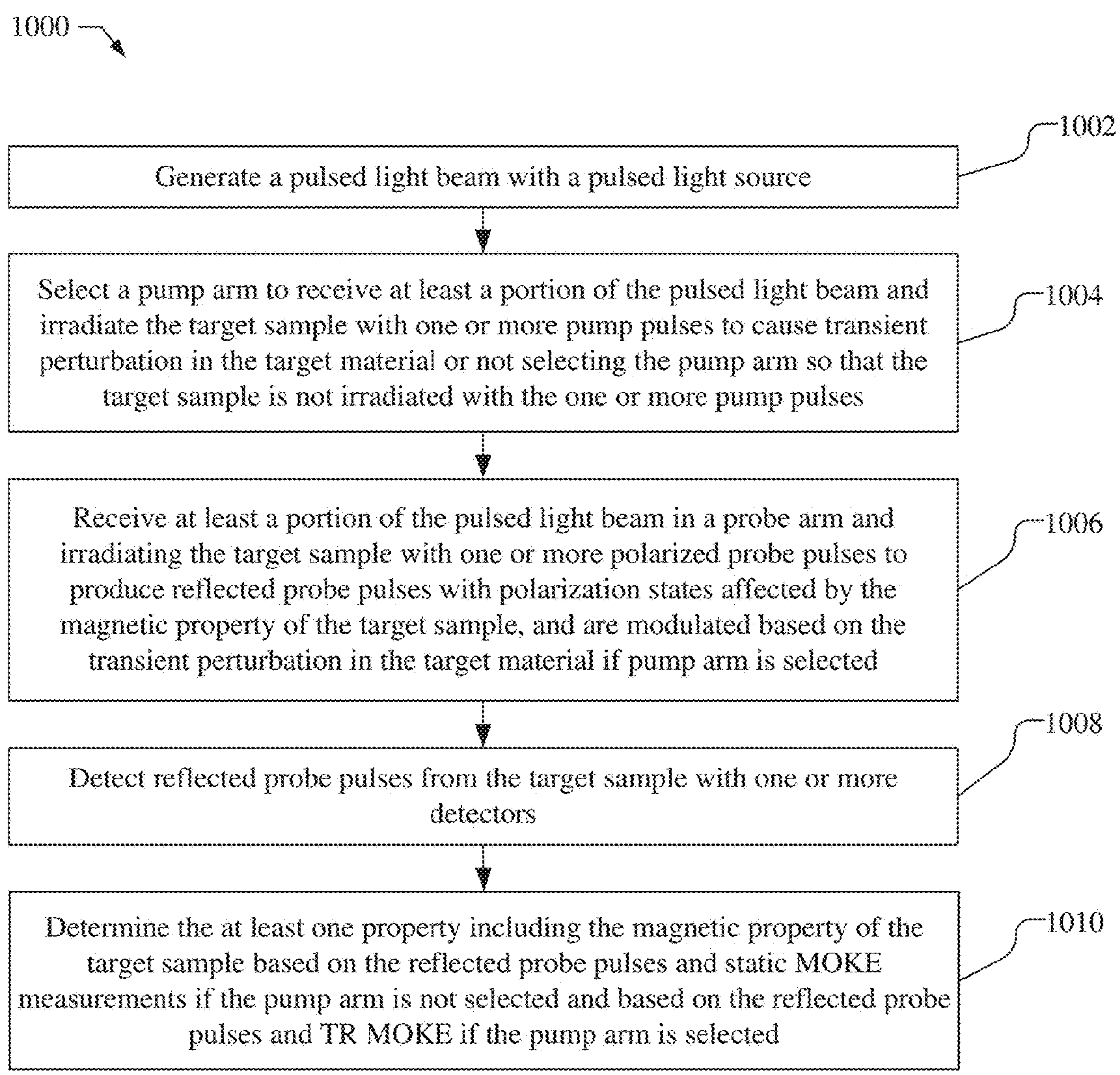
FIG. 10 is a flow chart illustrating a method of selectably performing MOKE and TR MOKE metrology.

FIG. 10 is a flow chart 1000 illustrating a method of operation of an optical metrology device, such as optical metrology device 100 or 400 to perform optical metrology measurements on a target sample, as discussed herein. For example, the method of operation may be for measuring at least one property including a magnetic property of a target sample using at least one of static magneto-optical Kerr effect (MOKE), time-resolved MOKE (TR MOKE), or a combination thereof.

At block 1002, the optical metrology device generates a pulsed light beam with a pulsed light source, e.g., as illustrated by pulsed light source 110 producing a pulsed light beam 111 in FIG. 1A or light source 402, intensity control 403, beam expander 404, and chopper 406 illustrated in FIGS. 4-8. A means for generating a pulsed light beam may include, e.g., the pulsed light source 110 in FIG. 1A or the light source 402, intensity control 403, beam expander 404, and chopper 406 illustrated in FIGS. 4-8.

At block 1004, the optical metrology device selects a pump arm to receive at least a portion of the pulsed light beam and irradiate the target sample with one or more pump pulses to cause transient perturbation in the target material or does not select the pump arm so that the target sample is not irradiated with the one or more pump pulses, e.g., as illustrated with beam selecting element 117 and pump arm 120 producing pump beam 121 shown in FIG. 1A or shutter 410 and pump arm 420 shown in FIGS. 4-8. A means for selecting a pump arm to receive at least a portion of the pulsed light beam and irradiate the target sample with one or more pump pulses to cause transient perturbation in the target material or not selecting the pump arm so that the target sample is not irradiated with the one or more pump pulses may include, e.g., the beam selecting element 117 (which may be the polarizer 117' and beam splitter 115) in FIG. 1A or shutter 410, flip mirror or other movable element, or an electrically controlled elements, such as an electrochromic optical switch, that may become opaque with the application of a current or voltage, or a polarizing element (e.g., polarizer P1) and beam splitter 408, which may be a polarizing beam splitter, and pump arm 420 as described in reference to FIGS. 4-8.

At block 1006, the optical metrology device may receive at least a portion of the pulsed light beam in a probe arm and irradiate the target sample with one or more polarized probe pulses to produce reflected probe pulses with polarization states affected by the magnetic property of the target sample, and are modulated based on the transient perturbation in the target material if pump arm is selected, e.g., as illustrated by probe arm 130 producing probe beam 131 in FIG. 1A or probe arm 430 in FIGS. 4-8. A means for receiving at least a portion of the pulsed light beam in a probe arm and irradiating the target sample with one or more polarized probe pulses to produce reflected probe pulses with polarization states affected by the magnetic property of the target sample, and are modulated based on the transient perturbation in the target material if pump arm is selected may include the probe arm 130 in FIG. 1A or probe arm 430 in FIGS. 4-8.

At block 1008, the optical metrology device detects reflected probe pulses from the target sample with one or more detectors, e.g., as illustrated by detector arm 140 with detectors 144 and/or 146 in FIG. 1A or detector arm 440 with the first detector 444 and the second detector 446 in FIGS. 4-8. A means for detecting reflected probe pulses from the target sample may include detectors 144 and/or 146 in FIG. 1A or the first detector 444 and the second detector 446 in FIGS. 4-8.

At block 1010, the optical metrology device determines the at least one property including the magnetic property of the target sample based on the reflected probe pulses and static MOKE measurements if the pump arm is not selected and based on the reflected probe pulses and TR MOKE if the pump arm is selected, e.g., as discussed in reference to controller 150 in FIG. 1A or controller 450 in FIGS. 4-8. A means for determining the at least one property including the magnetic property of the target sample based on the reflected probe pulses and static MOKE measurements if the pump arm is not selected and based on the reflected probe pulses and TR MOKE if the pump arm is selected may include the controller 150 in FIG. 1A or controller 450 in FIGS. 4-8.

In one implementation, the optical metrology device may determine the at least one property by determining at least one of characteristics of a magnetic stack deposition, annealing, or magnetization or a combination thereof based on static MOKE if pump arm is not selected and determining at least one of characteristics of magnetization dynamics, magnetic switching, or control of individual bits or a combination thereof based on TR MOKE if the pump arm is selected, e.g., as discussed in reference to FIGS. 1A and 1B. A means for determining at least one of characteristics of a magnetic stack deposition, annealing, or magnetization or a combination thereof based on static MOKE if pump arm is not selected and determining at least one of characteristics of magnetization dynamics, magnetic switching, or control of individual bits or a combination thereof based on TR MOKE if the pump arm is selected may include the controller 150 in FIG. 1A or controller 450 in FIGS. 4-8.

In one implementation, the optical metrology device may move a movable element to select the pump arm, e.g., as discussed in reference to the beam selecting element 117 in FIG. 1A or shutter 410 in FIGS. 4-8. A means for moving a movable element to select the pump arm may include, e.g., the beam selecting element 117 and controller 150 in FIG. 1A or shutter 410, flip mirror or other movable element and controller 450 in FIGS. 4-8.

In one implementation, the optical metrology device may generate the pulsed light beam with the pulsed light source by generating the pulsed light beam with a pulsed laser, e.g., as discussed in reference to pulsed light source 110 in FIG. 1A.

In one implementation, the optical metrology device may control a time delay between irradiating the target sample with each pump pulse and irradiating the target sample with corresponding probe pulses with a variable delay that operates on the pulsed light beam, e.g., as discussed in reference to the pump arm 120, delay stage 122, probe arm 130 and delay stage 132 in FIG. 1A or pump arm 420, delay stage 422, probe arm 430 and delay stage 432 in FIGS. 4-8. A means for controlling a time delay between irradiating the target sample with each pump pulse and irradiating the target sample with corresponding probe pulses with a variable delay that operates on the pulsed light beam may include, e.g., the delay stage 122 and/or delay stage 132 and controller 150 in FIG. 1A or delay stage 422 and/or delay stage 432 and controller 450 in FIGS. 4-8. For example, the variable delay may be in the selectable pump arm and operate on the pulsed light beam in the selectable pump arm, e.g., as discussed in reference to the delay stage 122 in pump arm 120 in FIG. 1A or delay stage 422 in pump arm 420 in FIGS. 4-8.

In one implementation, the optical metrology device periodically phase modulates the one or more polarized probe pulses with a phase modulator in the probe arm to measure the at least one property including the magnetic property of the target sample based on static MOKE if the pump arm is not selected, e.g., as discussed in reference to modulator 139 (which may be, e.g., an EOM, an AOM, PEM, or a rotating compensator) in probe arm 130 in FIG. 1A or the EOM 439 in probe arm 430 in FIGS. 4-8. The optical metrology device may further periodically modulate intensity of the one or more pump pulses with an amplitude modulator in the selectable pump arm to measure the at least one property including the magnetic property of the target sample based on TR MOKE if the pump arm is selected, e.g., as discussed in reference to modulator 126 (which may be, e.g., an EOM, an AOM, PEM, or a chopper) in pump arm 120 in FIG. 1A or EOM 426 in pump arm 420 in FIGS. 4-8. A means for periodically phase modulating the one or more polarized probe pulses to measure the at least one property including the magnetic property of the target sample based on static MOKE if the pump arm is not selected may include the modulator 139 (which may be, e.g., an EOM, an AOM, PEM, or a rotating compensator) in FIG. 1A or the EOM 439 in FIGS. 4-8. A means for periodically modulating intensity of the one or more pump pulses to measure the at least one property including the magnetic property of the target sample based on TR MOKE if the pump arm is selected may include the modulator 126 (which may be, e.g., an EOM, an AOM, PEM, or a rotating compensator) in FIG. 1A or EOM 426 in FIGS. 4-8.

By way of example, the amplitude modulator in the selectable pump arm may modulate intensity of the one or more pump pulses to perform an opto-acoustic measurement of the target sample as discussed in FIGS. 1A and FIGS. 4-8. The phase modulator in the probe arm, for example, may modulate intensity of the one or more probe pulses to perform the opto-acoustic measurement of the target sample as discussed in FIGS. 1A and FIGS. 4-8.

By way of example, the optical metrology device may perform an ellipsometry measurement of the target sample by phase modulating the one or more polarized probe pulses with the phase modulator in the probe arm or intensity modulating the one or more pump pulses with the amplitude modulator in the selectable pump arm as discussed in FIGS. 1A and FIGS. 4-8. For example, the pump arm may be selectable to cause the transient perturbation in the target material if the pump arm is selected and to not irradiate the target sample if the pump arm is not selected, wherein the pump arm is selected for the time-resolved MOKE measurements or a time-resolved ellipsometry measurement and the pump arm is not selected and the phase modulator periodically phase modulates the one or more probe pulses for the ellipsometry measurement as discussed in FIG. 1A and FIGS. 4-8. In some implementations, the optical metrology device may periodically modulate intensity of the one or more pump pulses with the amplitude modulator in the pump arm for the time-resolved MOKE measurements or a time-resolved ellipsometry measurement as discussed in FIGS. 1A and FIGS. 4-8. In some implementations, the one or more detectors may include a first detector for detecting P state polarization of the reflected probe pulses and a second detector for detecting S state polarization of the reflected probe pulses, wherein both the first detector and the second detector are used for the time-resolved MOKE measurements, and only one of the first detector and the second detector is used for the ellipsometry measurements as discussed in FIGS. 1A and FIGS. 4-8. For example, the optical metrology device may demodulate signals from the first detector and the second detector generated based on the received reflected probe pulses from the target sample with a lock-in amplifier coupled to the first detector and the second detector, as discussed in reference to lock-in amplifier 148 in FIG. 1A or lock-in amplifier 448 in FIGS. 4-8. A means for demodulating signals from the first detector and the second detector generated based on the received reflected probe pulses from the target sample may include a lock-in amplifier 148 in FIG. 1A or lock-in amplifier 448 in FIGS. 4-8.

In one implementation, the optical metrology device may irradiate the target sample with the one or more pump pulses at normal incidence using a first set of optical elements, e.g., as pump arm 120 in FIG. 1A or pump arm 420 and lens L1 in FIGS. 4-8. In one implementation, the optical metrology device may irradiate the target sample with the one or more pump pulses at a non-normal angle of incidence, e.g., between a normal and 70° incidence angle. The optical metrology device may irradiate the target sample with the one or more probe pulses at oblique incidence with a second set of optical elements, e.g., as probe arm 130 in FIG. 1A or probe arm 430 and lens L2 in FIGS. 4-8. A means for irradiating the target sample with the one or more pump pulses at normal incidence may include lens L1 in FIGS. 4-8. A means for irradiating the target sample with the one or more pump pulses at a non-normal angle of incidence may include lens L1 in FIGS. 4-8. A means for irradiating the target sample with the one or more probe pulses at oblique incidence may include lens L2 in FIGS. 4-8.

Figure 11:
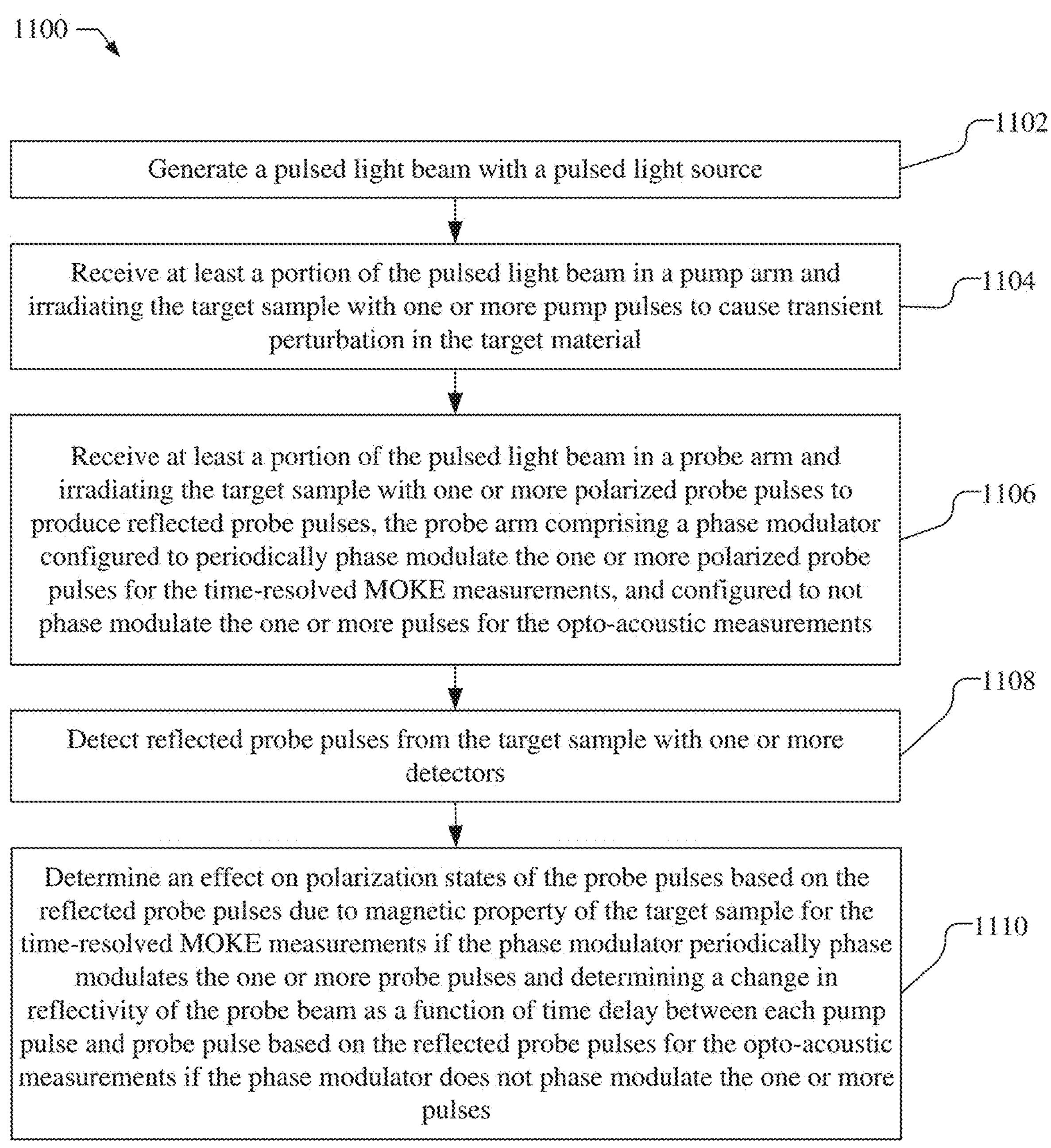
FIG. 11 is a flow chart illustrating a method of operation of an optical metrology device to perform optical metrology measurements on a target sample.

FIG. 11 is a flow chart 1100 illustrating a method of operation of an optical metrology device, such as optical metrology device 100 or 400 to perform optical metrology measurements on a target sample, as discussed herein. For example, the method of operation may be for measuring at least one property including a magnetic property of a target sample using at least one of time-resolved magneto-optical Kerr effect (MOKE) measurements, opto-acoustic measurements, or a combination thereof.

At block 1102, the optical metrology device generates a pulsed light beam with a pulsed light source, e.g., as illustrated by pulsed light source 110 producing a pulsed light beam 111 in FIG. 1A or light source 402, intensity control 403, beam expander 404, and chopper 406 illustrated in FIGS. 4-8. A means for generating a pulsed light beam may include, e.g., the pulsed light source 110 in FIG. 1A or the light source 402, intensity control 403, beam expander 404, and chopper 406 illustrated in FIGS. 4-8.

At block 1104, the optical metrology device receives at least a portion of the pulsed light beam in a pump arm and irradiates the target sample with one or more pump pulses to cause transient perturbation in the target material, e.g., as illustrated with pump arm 120 producing pump beam 121 shown in FIG. 1A or pump arm 420 shown in FIGS. 4-8. A means for receiving at least a portion of the pulsed light beam in a pump arm and irradiating the target sample with one or more pump pulses to cause transient perturbation in the target material may include, e.g., the beam selecting element 117 (which may be the polarizer 117' and beam splitter 115) and the pump arm 120 in FIG. 1A or shutter 410, flip mirror or other movable element, or an electrically controlled elements, such as an electrochromic optical switch, that may become opaque with the application of a current or voltage, or a polarizing element (e.g., polarizer P1) and beam splitter 408, which may be a polarizing beam splitter, and pump arm 420, and lens L1 as described in reference to FIGS. 4-8.

At block 1106, the optical metrology device may receive at least a portion of the pulsed light beam in a probe arm and irradiate the target sample with one or more polarized probe pulses to produce reflected probe pulses, the probe arm comprising a phase modulator configured to periodically phase modulate the one or more polarized probe pulses for the time-resolved MOKE measurements, and configured to not phase modulate the one or more pulses for the opto-acoustic measurements, e.g., as illustrated by probe arm 130 producing probe beam 131 and modulator 139 (which may be, e.g., an EOM, an AOM, PEM, or a rotating compensator) in FIG. 1A or probe arm 430 and EOM 439 in FIGS. 4-8. A means for receiving at least a portion of the pulsed light beam in a probe arm and irradiating the target sample with one or more polarized probe pulses to produce reflected probe pulses, the probe arm comprising a phase modulator configured to periodically phase modulate the one or more polarized probe pulses for the time-resolved MOKE measurements, and configured to not phase modulate the one or more pulses for the opto-acoustic measurements may include the probe arm 130 and modulator 139 (which may be, e.g., an EOM, an AOM, PEM, or a rotating compensator) in FIG. 1A or probe arm 430, the EOM 439, and the lens L2 in FIGS. 4-8.

At block 1108, the optical metrology device detects reflected probe pulses from the target sample with one or more detectors, e.g., as illustrated by detector arm 140 with detectors 144 and/or 146 in FIG. 1A or detector arm 440 with the first detector 444 and the second detector 446 in FIGS. 4-8. A means for detecting reflected probe pulses from the target sample may include detectors 144 and/or 146 in FIG. 1A or the first detector 444 and the second detector 446 in FIGS. 4-8.

At block 1110, the optical metrology device determines an effect on polarization states of the probe pulses based on the reflected probe pulses due to magnetic property of the target sample for the time-resolved MOKE measurements if the phase modulator periodically phase modulates the one or more probe pulses and determining a change in reflectivity of the probe beam as a function of time delay between each pump pulse and probe pulse based on the reflected probe pulses for the opto-acoustic measurements if the phase modulator does not phase modulate the one or more pulses, e.g., as discussed in reference to controller 150 in FIG. 1A or controller 450 in FIGS. 4-8. A means for determining an effect on polarization states of the probe pulses based on the reflected probe pulses due to magnetic property of the target sample for the time-resolved MOKE measurements if the phase modulator periodically phase modulates the one or more probe pulses and determining a change in reflectivity of the probe beam as a function of time delay between each pump pulse and probe pulse based on the reflected probe pulses for the opto-acoustic measurements if the phase modulator does not phase modulate the one or more pulses may include the controller 150 in FIG. 1A or controller 450 in FIGS. 4-8.

In one implementation, the optical metrology device may determine the effect on polarization states of the probe pulses by determining at least one of characteristics of magnetization dynamics, magnetic switching, or control of individual bits or a combination thereof for the time-resolved MOKE measurements if the phase modulator periodically phase modulates the one or more probe pulses or determining the change in reflectivity of the probe beam as the function of time delay between each pump pulse and probe pulse comprises determining at least one of thickness measurement of a bottom electrode or metal layer thickness magnetic random access memory (MRAM), or a combination thereof for the opto-acoustic measurements if the phase modulator does not phase modulate the one or more pulses, e.g., as discussed in reference to FIGS. 1A and 1B. A means for determining at least one of characteristics of magnetization dynamics, magnetic switching, or control of individual bits or a combination thereof for the time-resolved MOKE measurements if the phase modulator periodically phase modulates the one or more probe pulses may include the controller 150 in FIG. 1A or controller 450 in FIGS. 4-8. A means for determining at least one of thickness measurement of a bottom electrode or metal layer thickness magnetic random access memory (MRAM), or a combination thereof for the opto-acoustic measurements if the phase modulator does not phase modulate the one or more pulses may include the controller 150 in FIG. 1A or controller 450 in FIGS. 4-8.

In one implementation, the optical metrology device may select the pump arm to cause the transient perturbation in the target material and not select the pump arm so the target sample is not irradiated with the one or more pump pulses, wherein the pump arm is selected for the time-resolved MOKE measurements or the opto-acoustic measurements and the pump arm is not selected and the phase modulator periodically phase modulates the one or more probe pulses for static MOKE measurements, wherein the at least one processor is configured to measure the magnetic property of the target sample based on static MOKE if the pump arm is not selected and the phase modulator periodically phase modulates the one or more probe pulses, e.g., as discussed in reference to the beam selecting element 117 and pump arm 120 and the controller 150 in FIG. 1A or shutter 410 and pump arm 420 and the controller 450 in FIGS. 4-8. A means for selecting the pump arm to cause the transient perturbation in the target material and not selecting the pump arm so the target sample is not irradiated with the one or more pump pulses, wherein the pump arm is selected for the time-resolved MOKE measurements or the opto-acoustic measurements and the pump arm is not selected and the phase modulator periodically phase modulates the one or more probe pulses for static MOKE measurements, wherein the at least one processor is configured to measure the magnetic property of the target sample based on static MOKE if the pump arm is not selected and the phase modulator periodically phase modulates the one or more probe pulses may be the beam selecting element 117 and pump arm 120 and the controller 150 in FIG. 1A or shutter 410 and pump arm 420 and the controller 450 in FIGS. 4-8.

In one implementation, the optical metrology device may move a movable element to select the pump arm, e.g., as discussed in reference to the beam selecting element 117 in FIG. 1A or shutter 410 in FIGS. 4-8. A means for moving a movable element to select the pump arm may include, e.g., the beam selecting element 117 and controller 150 in FIG. 1A or shutter 410, flip mirror or other movable element and controller 450 in FIGS. 4-8.

In one implementation, the optical metrology device periodically modulates intensity of the one or more pump pulses with an amplitude modulator in the pump arm for the time-resolved MOKE measurements or the opto-acoustic measurements, e.g., as discussed in reference to modulator 126 (which may be, e.g., an EOM, an AOM, PEM, or a chopper) in pump arm 120 in FIG. 1A or EOM 426 in pump arm 420 in FIGS. 4-8. A means for periodically modulating intensity of the one or more pump pulses with an amplitude modulator in the pump arm for the time-resolved MOKE measurements or the opto-acoustic measurements may include the modulator 126 (which may be, e.g., an EOM, an AOM, PEM, or a chopper) in FIG. 1A or EOM 426 in FIGS. 4-8.

In one implementation, the optical metrology device may periodically modulate intensity of the one or more polarized probe pulses with the amplitude modulator for the opto-acoustic measurements, as discussed in FIGS. 1A and FIGS. 4-8. A means for periodically modulating intensity of the one or more polarized probe pulses for the opto-acoustic measurements may include the modulator 139 (which may be, e.g., an EOM, an AOM, PEM, or a chopper) in FIG. 1A or EOM 439 in FIGS. 4-8.

In one implementation, the optical metrology device may generate the pulsed light beam with the pulsed light source by generating the pulsed light beam with a pulsed laser, e.g., as discussed in reference to pulsed light source 110 in FIG. 1A.

In one implementation, the optical metrology device may control a time delay between irradiating the target sample with each pump pulse and irradiating the target sample with corresponding probe pulses with a variable delay that operates on the pulsed light beam, e.g., as discussed in reference to the pump arm 120, delay stage 122, probe arm 130 and delay stage 132 in FIG. 1A or pump arm 420, delay stage 422, probe arm 430 and delay stage 432 in FIGS. 4-8. A means for controlling a time delay between irradiating the target sample with each pump pulse and irradiating the target sample with corresponding probe pulses with a variable delay that operates on the pulsed light beam may include, e.g., the delay stage 122 and/or delay stage 132 and controller 150 in FIG. 1A or delay stage 422 and/or delay stage 432 and controller 450 in FIGS. 4-8. For example, the variable delay may be in the selectable pump arm and operate on the pulsed light beam in the selectable pump arm, e.g., as discussed in reference to the delay stage 122 in pump arm 120 in FIG. 1A or delay stage 422 in pump arm 420 in FIGS. 4-8.

In one implementation, the optical metrology device may irradiate the target sample with the one or more pump pulses at normal incidence using a first set of optical elements, e.g., as pump arm 120 in FIG. 1A or pump arm 420 and lens L1 in FIGS. 4-8. In one implementation, the optical metrology device may irradiate the target sample with the one or more pump pulses at a non-normal angle of incidence, e.g., between a normal and 70° incidence angle. The optical metrology device may irradiate the target sample with the one or more probe pulses at oblique incidence with a second set of optical elements, e.g., as probe arm 130 in FIG. 1A or probe arm 430 and lens L2 in FIGS. 4-8. A means for irradiating the target sample with the one or more pump pulses at normal incidence may include lens L1 in FIGS. 4-8. A means for irradiating the target sample with the one or more pump pulses at Za non-normal angle of incidence may include lens L1 in FIGS. 4-8. A means for irradiating the target sample with the one or more probe pulses at oblique incidence may include lens L2 in FIGS. 4-8.

By way of example, the optical metrology device may perform an ellipsometry measurement of the target sample by phase modulating the one or more polarized probe pulses with the phase modulator in the probe arm as discussed in FIGS. 1A and FIGS. 4-8. For example, the pump arm may be selectable to cause the transient perturbation in the target material if the pump arm is selected and to not irradiate the target sample if the pump arm is not selected, wherein the pump arm is selected for the time-resolved MOKE measurements or a time-resolved ellipsometry measurement and the pump arm is not selected and the phase modulator periodically phase modulates the one or more probe pulses for the ellipsometry measurement as discussed in FIGS. 1A and FIGS. 4-8. In some implementations, the optical metrology device may periodically modulate intensity of the one or more pump pulses with the amplitude modulator in the pump arm for the time-resolved MOKE measurements or a time-resolved ellipsometry measurement as discussed in FIGS. 1A and FIGS. 4-8. In some implementations, the one or more detectors may include a first detector for detecting P state polarization of the reflected probe pulses and a second detector for detecting S state polarization of the reflected probe pulses, wherein both the first detector and the second detector are used for the time-resolved MOKE measurements, and only one of the first detector and the second detector is used for the ellipsometry measurements as discussed in FIGS. 1A and FIGS. 4-8. For example, the optical metrology device may demodulate signals from the first detector and the second detector generated based on the received reflected probe pulses from the target sample with a lock-in amplifier coupled to the first detector and the second detector, as discussed in reference to lock-in amplifier 148 in FIG. 1A or lock-in amplifier 448 in FIGS. 4-8. A means for demodulating signals from the first detector and the second detector generated based on the received reflected probe pulses from the target sample may include a lock-in amplifier 148 in FIG. 1A or lock-in amplifier 448 in FIGS. 4-8.

Figure 12:
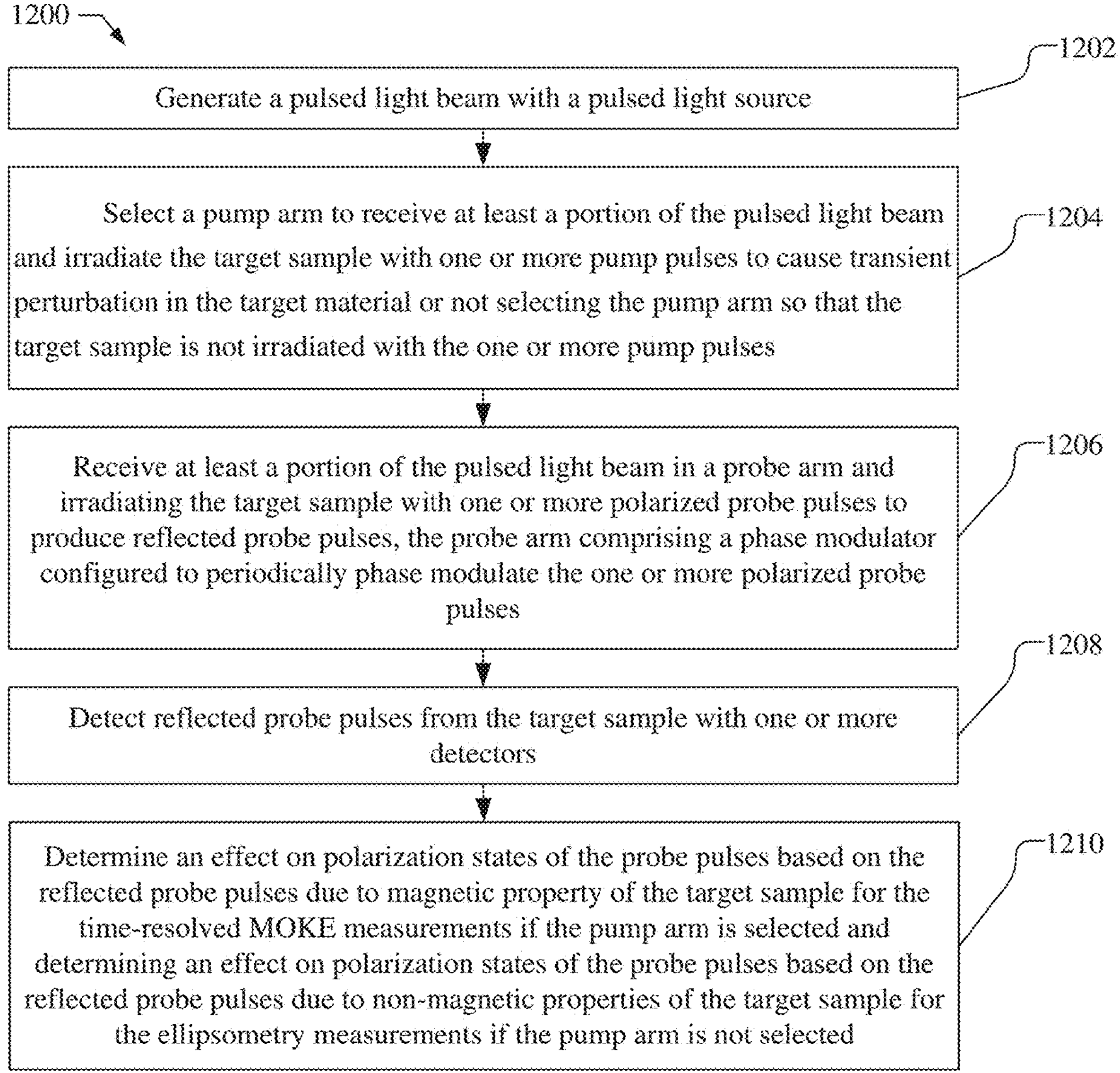
FIG. 12 is a flow chart illustrating a method of operation of an optical metrology device to perform optical metrology measurements on a target sample.

FIG. 12 is a flow chart 1200 illustrating a method of operation of an optical metrology device, such as optical metrology device 100 or 400 to perform optical metrology measurements on a target sample, as discussed herein. For example, the method of operation may be for measuring at least one property including a magnetic property of a target sample using at least one of time-resolved magneto-optical Kerr effect (MOKE) measurements, ellipsometry measurements, or a combination thereof.

At block 1202, the optical metrology device generates a pulsed light beam with a pulsed light source, e.g., as illustrated by pulsed light source 110 producing a pulsed light beam 111 in FIG. 1A or light source 402, intensity control 403, beam expander 404, and chopper 406 illustrated in FIGS. 4-8. A means for generating a pulsed light beam may include, e.g., the pulsed light source 110 in FIG. 1A or the light source 402, intensity control 403, beam expander 404, and chopper 406 illustrated in FIGS. 4-8.

At block 1204, the optical metrology device selects a pump arm to receive at least a portion of the pulsed light beam and irradiate the target sample with one or more pump pulses to cause transient perturbation in the target material or does not select the pump arm so that the target sample is not irradiated with the one or more pump pulses, e.g., as illustrated with beam selecting element 117 and pump arm 120 producing pump beam 121 shown in FIG. 1A or shutter 410 and pump arm 420 shown in FIGS. 4-8. A means for selecting a pump arm to receive at least a portion of the pulsed light beam and irradiate the target sample with one or more pump pulses to cause transient perturbation in the target material or not selecting the pump arm so that the target sample is not irradiated with the one or more pump pulses may include, e.g., the beam selecting element 117 (which may be the polarizer 117' and beam splitter 115) in FIG. 1A or shutter 410, flip mirror or other movable element, or an electrically controlled elements, such as an electrochromic optical switch, that may become opaque with the application of a current or voltage, or a polarizing element (e.g., polarizer P1) and beam splitter 408, which may be a polarizing beam splitter, and pump arm 420 as described in reference to FIGS. 4-8.

At block 1206, the optical metrology device may receive at least a portion of the pulsed light beam in a probe arm and irradiate the target sample with one or more polarized probe pulses to produce reflected probe pulses, the probe arm comprising a phase modulator configured to periodically phase modulate the one or more polarized probe pulses, e.g., as illustrated by probe arm 130 producing probe beam 131 and modulator 139 (which may be, e.g., an EOM, an AOM, PEM, or a rotating compensator) in FIG. 1A or probe arm 430 and modulator 439 in FIGS. 4-8. A means for receiving at least a portion of the pulsed light beam in a probe arm and irradiating the target sample with one or more polarized probe pulses to produce reflected probe pulses, the probe arm comprising a phase modulator configured to periodically phase modulate the one or more polarized probe pulses may include the probe arm 130 and modulator 139 (which may be, e.g., an EOM, an AOM, PEM, or a rotating compensator) in FIG. 1A or probe arm 430 and EOM 439 in FIGS. 4-8.

At block 1208, the optical metrology device detects reflected probe pulses from the target sample with one or more detectors, e.g., as illustrated by detector arm 140 with detectors 144 and/or 146 in FIG. 1A or detector arm 440 with the first detector 444 and the second detector 446 in FIGS. 4-8. A means for detecting reflected probe pulses from the target sample may include detectors 144 and/or 146 in FIG. 1A or the first detector 444 and the second detector 446 in FIGS. 4-8.

At block 1210, the optical metrology device determines an effect on polarization states of the probe pulses based on the reflected probe pulses due to magnetic property of the target sample for the time-resolved MOKE measurements if the pump arm is selected and determines an effect on polarization states of the probe pulses based on the reflected probe pulses due to non-magnetic properties of the target sample for the ellipsometry measurements if the pump arm is not selected, e.g., as discussed in reference to controller 150 in FIG. 1A or controller 450 in FIGS. 4-8. A means for determining an effect on polarization states of the probe pulses based on the reflected probe pulses due to magnetic property of the target sample for the time-resolved MOKE measurements if the pump arm is selected and determining an effect on polarization states of the probe pulses based on the reflected probe pulses due to non-magnetic properties of the target sample for the ellipsometry measurements if the pump arm is not selected may include the controller 150 in FIG. 1A or controller 450 in FIGS. 4-8.

In one implementation, the optical metrology device may determine the effect on polarization states of the probe pulses by determining at least one of characteristics of magnetization dynamics, magnetic switching, or control of individual bits or a combination thereof for the time-resolved MOKE measurements if the pump arm is selected or determining at least one of thickness measurement of a bottom electrode or metal layer thickness magnetic random access memory (MRAM), or a combination thereof for the ellipsometry measurements if the pump arm is not selected, e.g., as discussed in reference to FIGS. 1A and 1B. A means for determining at least one of characteristics of magnetization dynamics, magnetic switching, or control of individual bits or a combination thereof for the time-resolved MOKE measurements if the pump arm is selected or determining at least one of thickness measurement of a bottom electrode or metal layer thickness magnetic random access memory (MRAM), or a combination thereof for the ellipsometry measurements if the pump arm is not selected may include the controller 150 in FIG. 1A or controller 450 in FIGS. 4-8.

In one implementation, the optical metrology device may periodically modulate intensity of the one or more pump pulses for the time-resolved MOKE measurements with an amplitude modulator, e.g., as discussed in reference to modulator 126 (which may be, e.g., an EOM, an AOM, PEM, or a chopper) in pump arm 120 in FIG. 1A or EOM 426 in pump arm 420 in FIGS. 4-8. A means for periodically modulating intensity of the one or more pump pulses for the time-resolved MOKE measurements may include the modulator 126 (which may be, e.g., an EOM, an AOM, PEM, or a chopper) in FIG. 1A or EOM 426 in FIGS. 4-8.

In one implementation, the optical metrology device may determine time resolved effects on polarization states of the probe pulses due to non-magnetic properties of the target sample for time-resolved ellipsometry measurements if the pump arm is selected as discussed in FIGS. 1A and FIGS. 4-8. A means for determining time resolved effects on polarization states of the probe pulses due to non-magnetic properties of the target sample for time-resolved ellipsometry measurements if the pump arm is selected may include the controller 150 in FIG. 1A or controller 450 in FIGS. 4-8.

In one implementation, the phase modulator in the probe arm may be configured to not phase modulate the one or more pulses for opto-acoustic measurements, and the optical metrology device may determine a change in reflectivity of the probe beam as a function of time delay between each pump pulse and probe pulse for the opto-acoustic measurements if the phase modulator does not phase modulate the one or more pulses, as discussed in FIGS. 1A and FIGS. 4-8. A means for determining a change in reflectivity of the probe beam as a function of time delay between each pump pulse and probe pulse for the opto-acoustic measurements if the phase modulator does not phase modulate the one or more pulses may include the controller 150 in FIG. 1A or controller 450 in FIGS. 4-8.

In some implementations, the one or more detectors may include a first detector for detecting P state polarization of the reflected probe pulses and a second detector for detecting S state polarization of the reflected probe pulses, wherein both the first detector and the second detector are used for the time-resolved MOKE measurements, and only one of the first detector and the second detector is used for the opto-acoustic measurements and the ellipsometry measurements as discussed in FIGS. 1A and FIGS. 4-8. For example, the optical metrology device may demodulate signals from the first detector and the second detector generated based on the received reflected probe pulses from the target sample with a lock-in amplifier coupled to the first detector and the second detector, as discussed in reference to lock-in amplifier 148 in FIG. 1A or lock-in amplifier 448 in FIGS. 4-8. A means for demodulating signals from the first detector and the second detector generated based on the received reflected probe pulses from the target sample may include a lock-in amplifier 148 in FIG. 1A or lock-in amplifier 448 in FIGS. 4-8.

In one implementation, the optical metrology device may not select the pump arm so that the target sample is not irradiated with the one or more pump pulses and may periodically phase modulate the one or more probe pulses with the phase modulator for static MOKE measurements, and the optical metrology device may determine the magnetic property of the target sample based on static MOKE if the pump arm is not selected and the phase modulator periodically phase modulates the one or more probe pulses, e.g., as discussed in reference to the beam selecting element 117 and pump arm 120 and the controller 150 in FIG. 1A or shutter 410 and pump arm 420 and the controller 450 in FIGS. 4-8. A means for not selecting the pump arm so that the target sample is not irradiated with the one or more pump pulses may be the beam selecting element 117 and the controller 150 in FIG. 1A or shutter 410 and the controller 450 in FIGS. 4-8. A means for periodically phase modulating the one or more probe pulses for static MOKE measurements may include the modulator 139 (which may be, e.g., an EOM, an AOM, PEM, or a rotating compensator) in FIG. 1A or EOM 439 in FIGS. 4-8. A means for determining the magnetic property of the target sample based on static MOKE if the pump arm is not selected and the phase modulator periodically phase modulates the one or more probe pulses may include the controller 150 in FIG. 1A or the controller 450 in FIGS. 4-8.

In one implementation, the optical metrology device may move a movable element to select the pump arm, e.g., as discussed in reference to the beam selecting element 117 in FIG. 1A or shutter 410 in FIGS. 4-8. A means for moving a movable element to select the pump arm may include, e.g., the beam selecting element 117 and controller 150 in FIG. 1A or shutter 410, flip mirror or other movable element and controller 450 in FIGS. 4-8.

In one implementation, the optical metrology device may generate the pulsed light beam with the pulsed light source by generating the pulsed light beam with a pulsed laser, e.g., as discussed in reference to pulsed light source 110 in FIG. 1A.

In one implementation, the optical metrology device may control a time delay between irradiating the target sample with each pump pulse and irradiating the target sample with corresponding probe pulses with a variable delay that operates on the pulsed light beam, e.g., as discussed in reference to the pump arm 120, delay stage 122, probe arm 130 and delay stage 132 in FIG. 1A or pump arm 420, delay stage 422, probe arm 430 and delay stage 432 in FIGS. 4-8. A means for controlling a time delay between irradiating the target sample with each pump pulse and irradiating the target sample with corresponding probe pulses with a variable delay that operates on the pulsed light beam may include be, e.g., the delay stage 122 and/or delay stage 132 and controller 150 in FIG. 1A or delay stage 422 and/or delay stage 432 and controller 450 in FIGS. 4-8. For example, the variable delay may be in the pump arm and operates on the pulsed light beam in the selectable pump arm, e.g., as discussed in reference to the delay stage 122 in pump arm 120 in FIG. 1A or delay stage 422 in pump arm 420 in FIGS. 4-8.

In one implementation, the optical metrology device may irradiate the target sample with the one or more pump pulses at normal incidence using a first set of optical elements, e.g., as pump arm 120 in FIG. 1A or pump arm 420 and lens L1 in FIGS. 4-8. In one implementation, the optical metrology device may irradiate the target sample with the one or more pump pulses at a non-normal angle of incidence, e.g., between a normal and 70° incidence angle. The optical metrology device may irradiate the target sample with the one or more probe pulses at oblique incidence with a second set of optical elements, e.g., as probe arm 130 in FIG. 1A or probe arm 430 and lens L2 in FIGS. 4-8. A means for irradiating the target sample with the one or more pump pulses at normal incidence may include lens L1 in FIGS. 4-8. A means for irradiating the target sample with the one or more pump pulses at a non-normal angle of incidence may include lens L1 in FIGS. 4-8. A means for irradiating the target sample with the one or more probe pulses at oblique incidence may include lens L2 in FIGS. 4-8.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An apparatus for measuring at least one property including a magnetic property of a target sample using at least one of time-resolved magneto-optical Kerr effect (MOKE) measurements, ellipsometry measurements, or a combination thereof, the apparatus comprising:

a pulsed light source for generating a pulsed light beam;

a selectable pump arm that is configured to receive at least a portion of the pulsed light beam and irradiate the target sample with one or more pump pulses to cause transient perturbation in the target sample if the pump arm is selected and to not irradiate the target sample if the pump arm is not selected;

a probe arm that is configured to receive at least a portion of the pulsed light beam, and irradiate the target sample with one or more polarized probe pulses to produce reflected probe pulses, the probe arm comprising a phase modulator configured to periodically phase modulate the one or more polarized probe pulses;

one or more detectors for receiving reflected probe pulses from the target sample; and at least one processor coupled to the one or more detectors and configured to measure an effect on polarization states of the probe pulses due to magnetic property of the target sample for the time-resolved MOKE measurements if the pump arm is selected and to measure effect on polarization states of the probe pulses due to non-magnetic properties of the target sample for the ellipsometry measurements if the pump arm is not selected.

2. The apparatus of claim 1, wherein the at least one processor is configured to measure at least one of characteristics of magnetization dynamics, magnetic switching, or control of individual bits, or a combination thereof, for the time-resolved MOKE measurements if the pump arm is selected or to measure thickness of at least one of a bottom electrode or metal layer of a magnetic random access memory (MRAM), or a combination thereof, for the ellipsometry measurements if the pump arm is not selected.

3. The apparatus of claim 1, wherein the pump arm comprises an amplitude modulator that periodically modulates intensity of the one or more pump pulses for the time-resolved MOKE measurements.

4. The apparatus of claim 3, wherein the at least one processor is further configured to measure time resolved effects on polarization states of the probe pulses due to non-magnetic properties of the target sample for time-resolved ellipsometry measurements if the pump arm is selected.

5. The apparatus of claim 3, wherein the phase modulator in the probe arm is configured to not phase modulate the one or more pulses for opto-acoustic measurements, and wherein the at least one processor is further configured to measure a change in reflectivity of the probe pulses as a function of time delay between each pump pulse and probe pulse for the opto-acoustic measurements if the phase modulator does not phase modulate the one or more pulses.

6. The apparatus of claim 5, wherein the one or more detectors comprises a first detector for detecting P state polarization of the reflected probe pulses and a second detector for detecting S state polarization of the reflected probe pulses, wherein both the first detector and the second detector are used for the time-resolved MOKE measurements, and only one of the first detector and the second detector is used for the opto-acoustic measurements and the ellipsometry measurements.

7. The apparatus of claim 6, wherein the first detector and the second detector are coupled to a lock-in amplifier to demodulate signals from the first detector and the second detector generated based on the received reflected probe pulses from the target sample.

8. The apparatus of claim 1, wherein the pump arm is not selected and the phase modulator periodically phase modulates the one or more probe pulses for static MOKE measurements, wherein the at least one processor is configured to measure the magnetic property of the target sample based on static MOKE if the pump arm is not selected and the phase modulator periodically phase modulates the one or more probe pulses.

9. The apparatus of claim 1, further comprising a movable element to select the pump arm.

10. The apparatus of claim 1, wherein the pulsed light source for generating the pulsed light beam comprises a pulsed laser.

11. The apparatus of claim 1, further comprising a variable delay that operates on the pulsed light beam to control a time delay between irradiating the target sample with each pump pulse and irradiating the target sample with corresponding probe pulses.

12. The apparatus of claim 11, wherein the variable delay is in the selectable pump arm and operates on the pulsed light beam in the selectable pump arm.

13. The apparatus of claim 1, further comprising:

a first set of optical elements configured to irradiate the target sample with the one or more pump pulses at normal incidence; and a second set of optical elements configured to irradiate the target sample with the one or more probe pulses at oblique incidence.

14. A method for measuring at least one property including a magnetic property of a target sample using at least one of time-resolved magneto-optical Kerr effect (MOKE) measurements, ellipsometry measurements, or a combination thereof, the method comprising:

generating a pulsed light beam with a pulsed light source;

selecting a pump arm to receive at least a portion of the pulsed light beam and irradiate the target sample with one or more pump pulses to cause transient perturbation in the target sample or not selecting the pump arm so that the target sample is not irradiated with the one or more pump pulses;

receiving at least a portion of the pulsed light beam in a probe arm and irradiating the target sample with one or more polarized probe pulses to produce reflected probe pulses, the probe arm comprising a phase modulator configured to periodically phase modulate the one or more polarized probe pulses;

detecting reflected probe pulses from the target sample with one or more detectors; and determining an effect on polarization states of the probe pulses based on the reflected probe pulses due to magnetic property of the target sample for the time-resolved MOKE measurements if the pump arm is selected and determining an effect on polarization states of the probe pulses based on the reflected probe pulses due to non-magnetic properties of the target sample for the ellipsometry measurements if the pump arm is not selected.

15. The method of claim 14, wherein determining the effect on polarization states of the probe pulses comprises determining at least one of characteristics of magnetization dynamics, magnetic switching, or control of individual bits, or a combination thereof, for the time-resolved MOKE measurements if the pump arm is selected or determining thickness of at least one of a bottom electrode or metal layer of a magnetic random access memory (MRAM), or a combination thereof, for the ellipsometry measurements if the pump arm is not selected.

16. The method of claim 14, further comprising periodically modulating intensity of the one or more pump pulses for the time-resolved MOKE measurements with an amplitude modulator in the pump arm.

17. The method of claim 16, further comprising determining time resolved effects on polarization states of the probe pulses due to non-magnetic properties of the target sample for time-resolved ellipsometry measurements if the pump arm is selected.

18. The method of claim 16, wherein the phase modulator in the probe arm is configured to not phase modulate the one or more pulses for opto-acoustic measurements, and further comprising determining a change in reflectivity of the probe pulses as a function of time delay between each pump pulse and probe pulse for the opto-acoustic measurements if the phase modulator does not phase modulate the one or more pulses.

19. The method of claim 18, wherein the one or more detectors comprises a first detector for detecting P state polarization of the reflected probe pulses and a second detector for detecting S state polarization of the reflected probe pulses, wherein both the first detector and the second detector are used for the time-resolved MOKE measurements, and only one of the first detector and the second detector is used for the opto-acoustic measurements and the ellipsometry measurements.

20. The method of claim 19, further comprising demodulating signals from the first detector and the second detector generated based on the received reflected probe pulses from the target sample with a lock-in amplifier coupled to the first detector and the second detector.

21. The method of claim 14, further comprising not selecting the pump arm so that the target sample is not irradiated with the one or more pump pulses and periodically phase modulating the one or more probe pulses with the phase modulator for static MOKE measurements, and determining the magnetic property of the target sample based on static MOKE if the pump arm is not selected and the phase modulator periodically phase modulates the one or more probe pulses.

22. The method of claim 14, further comprising moving a movable element to select the pump arm.

23. The method of claim 14, wherein generating the pulsed light beam with the pulsed light source comprises generating the pulsed light beam with a pulsed laser.

24. The method of claim 14, further comprising controlling a time delay between irradiating the target sample with each pump pulse and irradiating the target sample with corresponding probe pulses with a variable delay that operates on the pulsed light beam.

25. The method of claim 24, wherein the variable delay is in the pump arm and operates on the pulsed light beam in the selectable pump arm.

26. The method of claim 14, further comprising:

irradiating the target sample with the one or more pump pulses at normal incidence with a first set of optical elements; and irradiating the target sample with the one or more probe pulses at oblique incidence with a second set of optical elements.

27. An apparatus for measuring at least one property including a magnetic property of a target sample using at least one of time-resolved magneto-optical Kerr effect (MOKE) measurements, ellipsometry measurements, or a combination thereof, the apparatus comprising:

means for generating a pulsed light beam;

means for selecting a pump arm to receive at least a portion of the pulsed light beam and irradiate the target sample with one or more pump pulses to cause transient perturbation in the target sample and or not selecting the pump arm so that the target sample is not irradiated with the one or more pump pulses;

means for receiving at least a portion of the pulsed light beam in a probe arm and irradiating the target sample with one or more polarized probe pulses to produce reflected probe pulses, the probe arm comprising a phase modulator configured to periodically phase modulate the one or more polarized probe pulses;

means for detecting reflected probe pulses from the target sample; and means for determining an effect on polarization states of the probe pulses based on the reflected probe pulses due to magnetic property of the target sample for the time-resolved MOKE measurements if the pump arm is selected and determining an effect on polarization states of the probe pulses based on the reflected probe pulses due to non-magnetic properties of the target sample for the ellipsometry measurements if the pump arm is not selected.

* * * * *